United States Patent [19]
Yamada

[11] Patent Number: 4,639,753
[45] Date of Patent: Jan. 27, 1987

[54] SEMICONDUCTOR DEVICE

[75] Inventor: Takahiro Yamada, Osaka, Japan

[73] Assignee: Matsushita Electric Industrial Co., Ltd., Japan

[21] Appl. No.: 725,353

[22] Filed: Apr. 19, 1985

[30] Foreign Application Priority Data

| Apr. 19, 1984 | [JP] | Japan | 59-78865 |
| May 31, 1984 | [JP] | Japan | 59-111158 |
| Jul. 18, 1984 | [JP] | Japan | 59-148828 |
| Aug. 28, 1984 | [JP] | Japan | 59-179749 |

[51] Int. Cl.$^4$ .......................................... H01L 29/80
[52] U.S. Cl. ........................................................ 357/22
[58] Field of Search ............... 357/22, 22 E, 23.14, 357/22 B, 22 C, 22 G, 24, 24 L, 30

[56] References Cited

U.S. PATENT DOCUMENTS

| 29,971 | 4/1879 | Nishizawa et al. | 357/23.14 X |
| 2,900,531 | 2/1957 | Wallmark | 357/22 X |
| 4,216,029 | 8/1980 | Ohki | 357/22 X |

OTHER PUBLICATIONS

IEEE Transactions on Electron Devices, vol. ED-22. Apr. 1975, "Field-Effect Transistor Versus Analog Transistor" by Nishizawa et al.
IEEE Transactions on Electron Devices, vol. ED-25, No. 7, Jul. 1978, "Characteristics of Static Induction Transistors" by Mochida et al.
IEEE Transactions on Electron Devices, vol. ED-27, No. 3, Mar. 1980, "Punching Through Device and Its Integration" by Ohmi.

Primary Examiner—Martin H. Edlow
Assistant Examiner—Sara W. Crane
Attorney, Agent, or Firm—Lowe, Price, Leblanc, Becker & Shur

[57] ABSTRACT

In a semiconductor device, the distance between a first gate region close to a source region and a second gate region, which are provided so as to sandwich therebetween a channel functioning as a path of carriers, is selected to be greater than a channel width determined by the second gate region, or a distance between a place where channel width determined by the second gate region is the narrowest (when WG2 is constant over the channel, a portion of the second gate closest to the source region), and a drain region is selected to be greater than the channel width, thereby electrostatic shielding is achieved. Furthermore, a potential barrier (intrinsic gate region) is formed within the channel at a place close to the first gate region to provide a new Shielding Ideal-Saturated Operation Static Induction Transistor (SISO-SIT) actualizing ideal saturated characteristic keeping high transconductance of an SIT having unsaturated characteristic. In addition as carrier motion within SISO-SIT undergoes nonscattering travelling, while the intrinsic gate region is arranged to include a tunnel barrier, a new tunnel transistor named Shielding Ideal-Saturated Operation and Ballistic Tunnel Transistor (SISO-BATT) exhibiting ideal saturated characteristic is provided. Charge transfer device having potential-setting function of high performance and solid state imaging device using a plurality of SISO-SITs according to the present invention as light-receiving elements are also disclosed.

11 Claims, 65 Drawing Figures

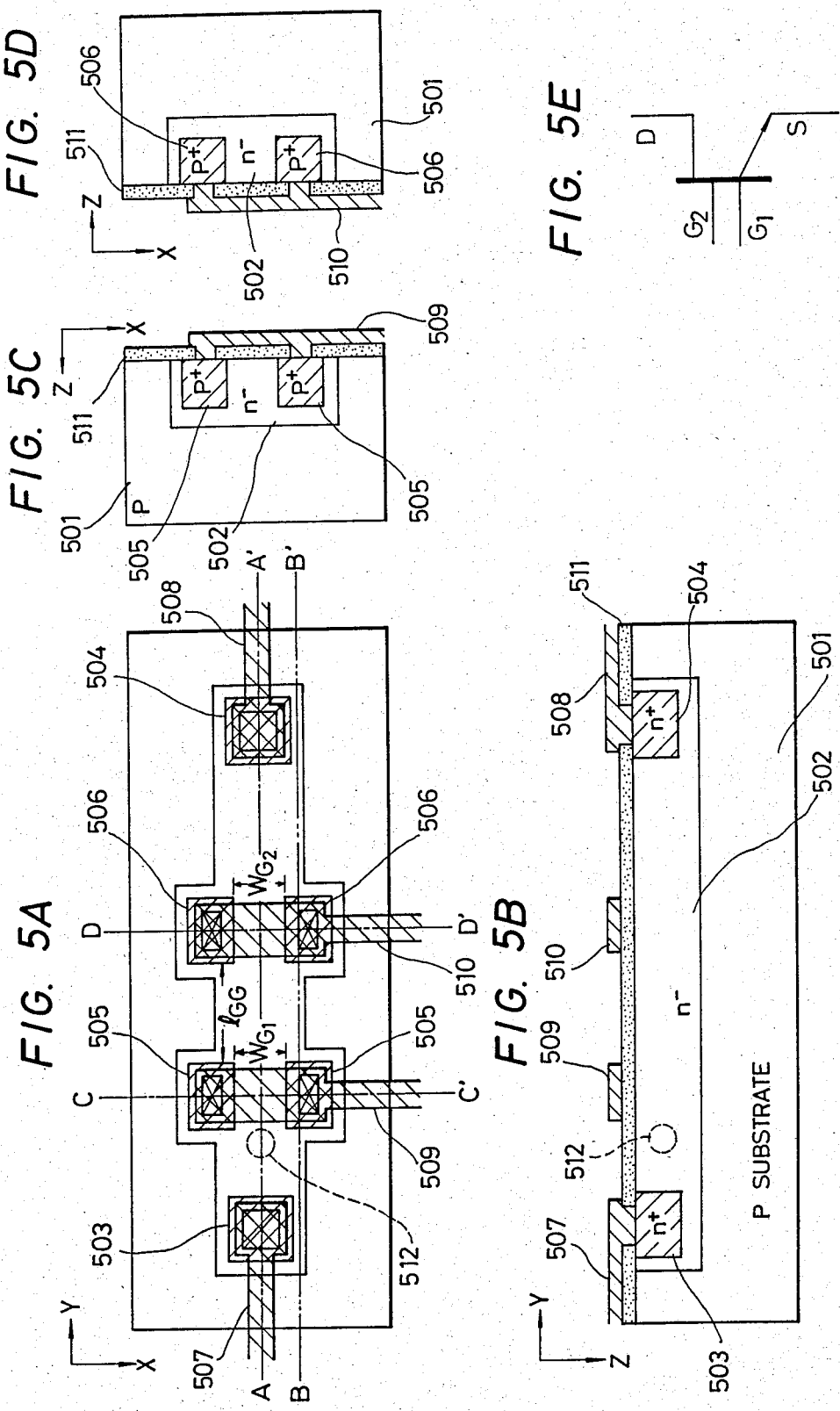

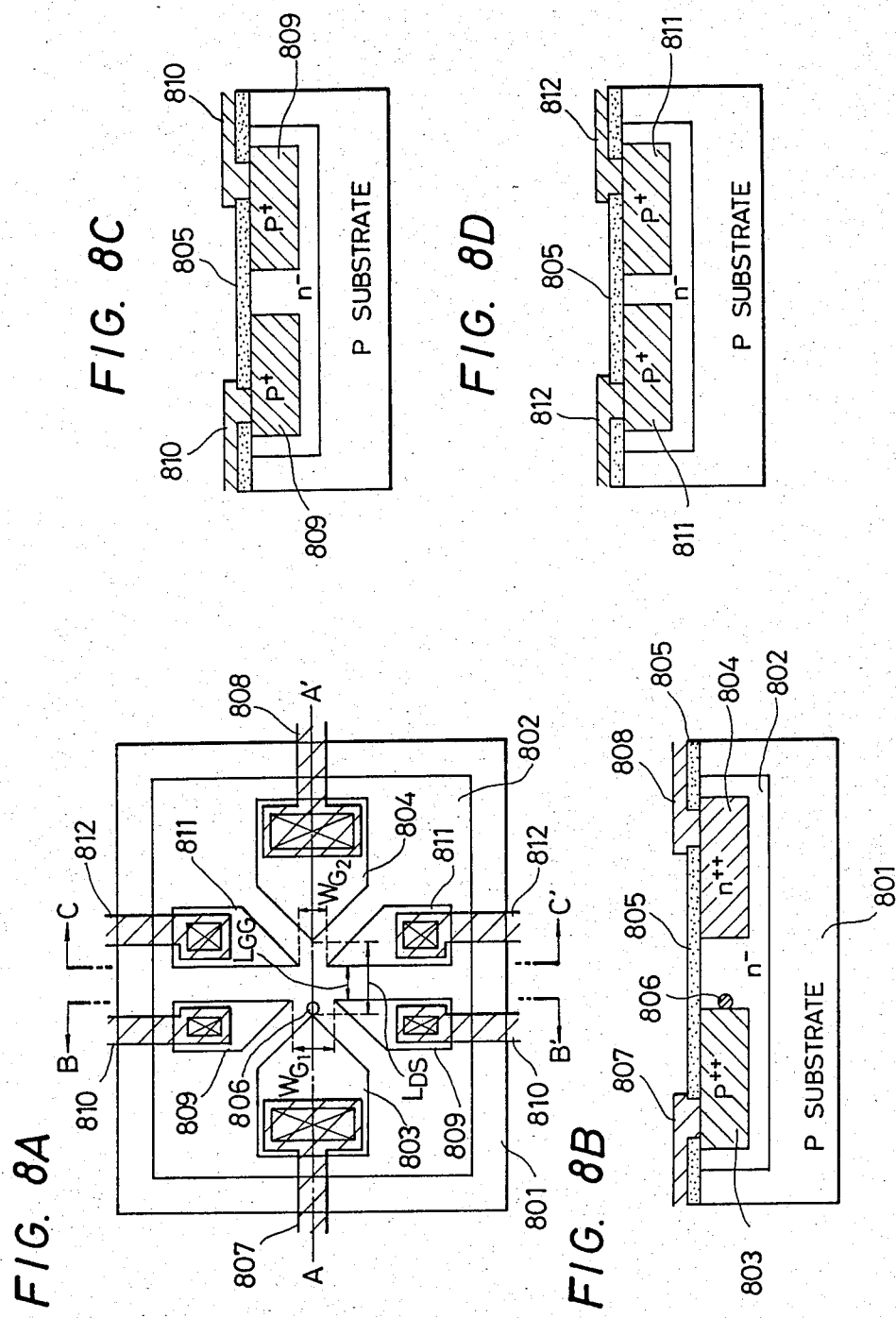

FIG. 18D
FIG. 18E
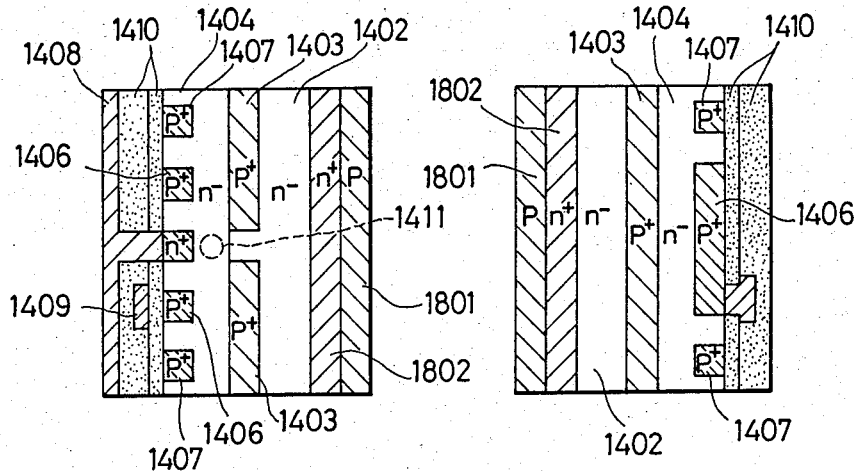
FIG. 19
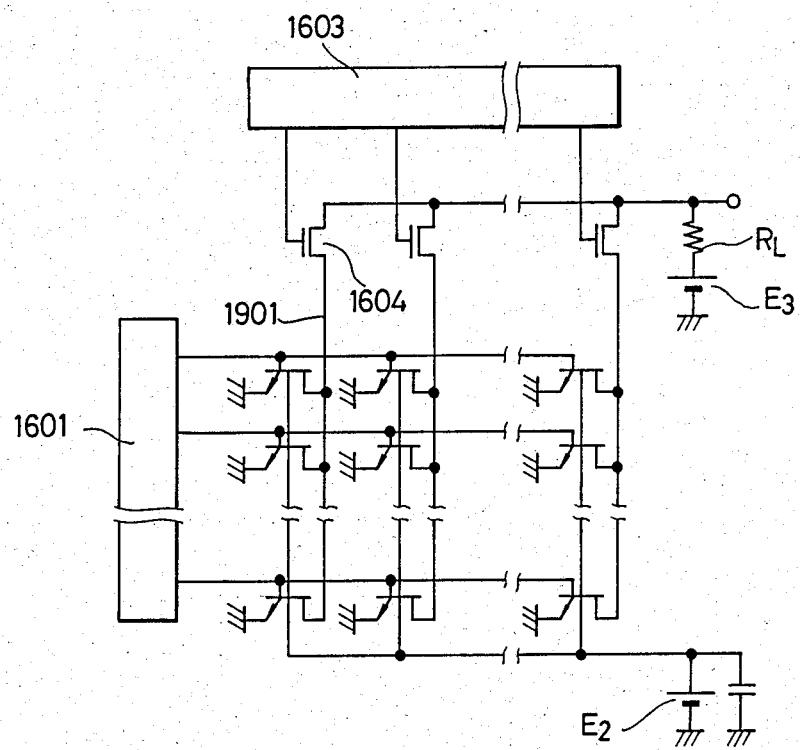

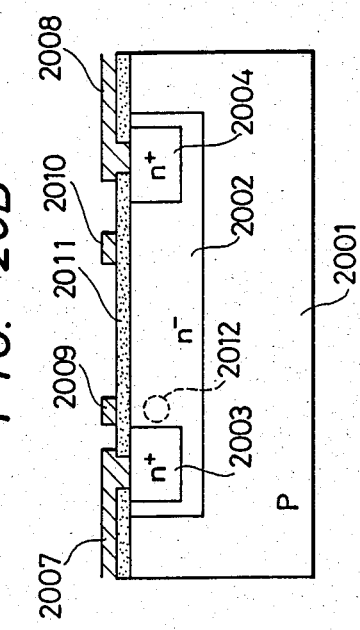
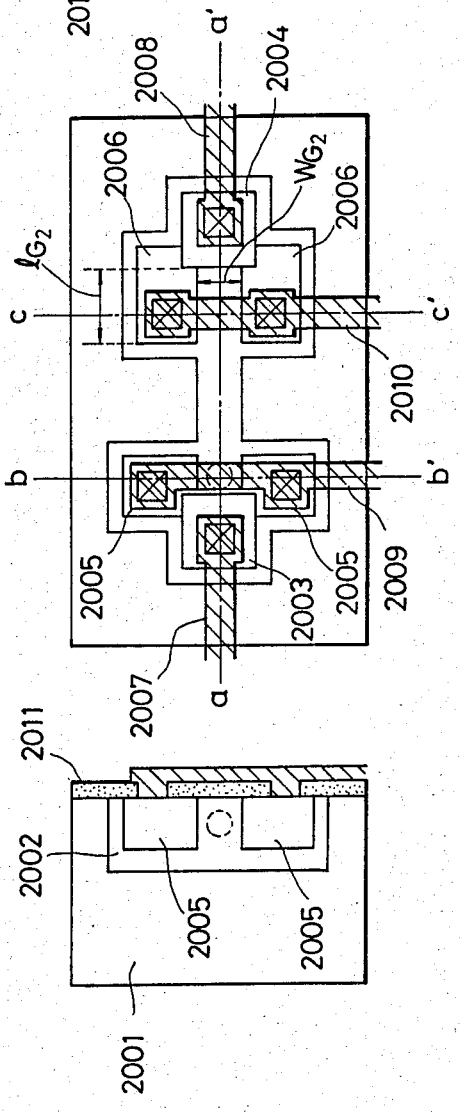
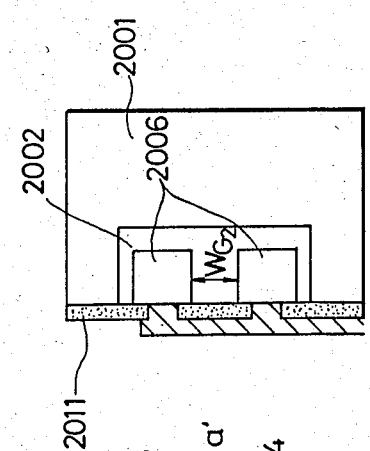
FIG. 20A  FIG. 20B  FIG. 20C  FIG. 20D  FIG. 20E

SEMICONDUCTOR DEVICE

BACKGROUND OF THE INVENTION

The present invention relates generally to semiconductor devices, and particularly to static induction transistors (SIT).

Conventional SITs are initially discussed herein for a better understanding of the present invention. FIG. 1 is a cross-sectional view of structure of a conventional junction gate type SIT, which is formed vertically (i.e., in a direction of the thickness of a substrate). This SIT comprises an n+ type source region 101, an n+ type drain region 102, a p+ type gate region 103 and an epitaxial region 104, used as a channel portion. The SIT has a channel with a small size compared to that of a field effect transistor (FET), and a low impurity concentration (approximately from $10^{12}$ to $10^{15}$ cm$^{-3}$). Thereby, in response to the gate being biased to zero or a slight reverse voltage being applied to gate, the SIT is energized to a pinch-off state in which the channel is completely covered by the depletion layer. Under these circumstances a saddle point potential barrier 201 appears in front of the source as shown in FIG. 2. The height of the potential barrier controls the flow rate of carriers mainly flowing from the source to drain (this potential barrier having an intrinsic gating function). Carriers flowing from the source to drain over the saddle point potential barrier, which is also referred to as intrinsic gate barrier, concentrate on the channel center region 202.

FIG. 3 is an X-Y-Z plot of potential distribution in a prior art SIT. Potential distributions A' and B' are respectively viewed along dotted lines A and B in FIG. 1. The center of the source is located at (0, 0), and the distance along the Y axis indicates distance from the source toward the drain. The gate is located along the Y axis at Y=$Y_G$, and the gate voltage is indicated at X=$\pm X_G$. The drain is located at Y=$Y_D$, while the source is located at Y=0. The depletion layer extends from $Y_G$ toward the source to Ys and toward the drain to Yd. The height, $\Psi$o, of the intrinsic gate barrier decreases in proportion to the drain voltage while the position of the barrier is shifted toward the source. Therefore the number of carriers climbing over the barrier increases so that unsaturated current-voltage (I-V) characteristics inherent to SIT are exhibited.

This unsaturated characteristic occurs because the height of the barrier of the intrinsic gate depends on both the gate voltage and the drain voltage. The unsaturated characteristic makes it difficult to obtain sufficient voltage gain. More specifically, assume that gain of a single stage amplifier is given by:

$$A_v = g_m R_L \times \frac{1}{(1 + R_L/r_D)} \tag{1}$$

wherein
$g_m = (\partial I_D/\partial V_G)$: transconductance;
$r_D = 1/(\partial I_D/\partial V_G)$: drain internal resistance;
$R_L$: load resistance;
$I_D$: drain current;
$V_G$: gate voltage;
$V_D$: drain voltage.

From the above equation, voltage gain is optimized when the value of $r_D$ is relatively large, so it has saturated characteristics.

When the saturated charcteristics are achieved by a negative feedback effect due to the presence of a source internal resistance $r_s$, in the same manner as generally provided in FETs, the apparent transconductance $g_m'$ is given by the following equation:

$$g_m' = \frac{g_m}{1 + r_s g_m} \tag{2}$$

Generally in the past the apparent transconductance $g'_m$ has been mistaken as the inherent transconductance of an FET. As $r_s$ becomes larger, $g_m'$ becomes smaller than $g_m$.

However, up to the present time, there has been no principle proposed for providing saturated characteristics without increasing $r_s$ with the large $g_m$ obtained by an unsaturated SIT. For practical applications, active devices having a potential setting function (based on saturated characteristics), as often used in integrated circuits, cannot be provided by an SIT structure.

One approach for providing high-speed active element operation is to use a tunnel transistor generally having an unsaturated V-I characteristic. This unsaturated characteristic occurs because the tunneling probability at the tunnel barrier depends on the voltages at the gate and drain regions; it has the disadvantage of the same small voltage gain shown by Eq. (1). Up to the present time, no consideration has been made of tunnel transistors having saturated characteristics.

In semiconductor memories and solid state imaging devices or the like, potential setting for vertical transmission lines or the like is necessary for transferring charge from a vertical transmission line forming a large capacitance charge storing region to a small capacitance charge storing region; a typical device of this type is known as a charge priming device (CPD).

FIG. 4A is a cross-sectional view of a basic CPD; FIG. 4B is an equivalent circuit of the CPD of FIG. 4A; and FIG. 4C is a timing diagram of driving pulses for the CPD. In FIG. 4A, capacitance $C_S$ is a charge-storing portion of an n+ region 401 formed on a p substrate 404, and capacitances $C_B$ and $C_D$ are respectively charge-storing portions of n+ regions 402 and 403. The capacitance values usually have the relationship $C_S > C_B > C_D$ as a general condition for using the CPD.

Inverted layer 405 between n+ regions 401 and 402 is formed when a voltage is applied to electrode TG1, to turn on MOSFET Q1. Similarly, when MOSFET Q2 turns on in response to a voltage being applied to electrode TG2, an inverted layer 406 is formed between n+ regions 402 and 403.

Initial potential setting is provided by setting the voltage at the n+ region 403 to $V_0$ by closing switch 408. After this switch 408 is opened, Resistor $R_L$ detects a signal.

The potential of the n+ region 402 is set to a channel voltage $V_1$ of an inverted layer 406, formed when the MOSFET Q2 turns on in response to the application of a voltage at the transfer gate electrode TG2. The voltage $V_1$ is determined by the voltage applied to the transfer gate electrode TG2, and is normally in a state of $V_1 < V_0$.

Similarly, the potential of the n+ region 401 is set to a channel voltage $V_2$ of an inverted layer 405 formed when the MOSFET Q1 turns on in response to the application of a voltage at the transfer gate electrode TG1. The voltage $V_2$ is determined by the voltage applied to the transfer gate electrode TG1; normally $V_2 < V_1$.

Charge transfer is carried out by priming transfer means from the n+ region 401 to the n+ region 403, as described infra. The above-mentioned priming transfer is described with reference to the timing chart of FIG. 4C.

When $t=t_1$, a high level of drive pulse $\phi_{TG1}$ is applied to the electrode TG1. At this time, the MOSFET Q1 turns on and an internal bias charge $Q_B = (V_2 - V_1) \times C_B$ corresponding to the difference $(V_2 - V_1)$ between the potential $V_1$ at the n+ region 402 and the potential $V_2$ at the inverted layer 405 is injected from the equivalent capacitance $C_B$ of the n+ region 402 to the equivalent capacitance $C_S$ of the n+ region 401. This phenomenon is referred to as fill-in. When capacitance $C_S$ has an initial charge $Q_S$, the resultant charge on capacitor $C_S$ is $Q_S + Q_B$.

Subsequently, when $t=t_2$, the pulse $\phi_{TC}$ is applied to the electrode TC while pulse $\phi_{TG1}$ is maintained at the high level. Because a static induction effect occurs between electrode TC and n+ region 402 via capacitance $C_0$ of insulator 407, a potential fluctuation $\Delta V$ is superimposed on the potential $V_2$ of the n+ region 402 so that the potential at the n+ region 402 is $(V_2 + \Delta V) = V_3$ $(> V_2)$.

As a result, charge $(Q_S + Q_B)$ is transferred from the n+ region 401 (at the voltage $V_2$) to the n+ region 402 (having an equivalent capacitance $C_B$) at a further deep potential $V_3$. This phenomenon is referred to as spill-out.

The combination of the above-mentioned fill-in and spill-out is referred to as fill-spill transfer, and transfer loss $E_P$ is given by the following equation when there is only an intrinsic tranfer limitation (see "DENSHI-ZAIRYO" Vol. 19, No. 12, 1980, Yamada et al):

$$E_P = \frac{1}{1 + A_P(Q_S + 2Q_B) + A_P^2(Q_S + Q_B)Q_B} \quad (3)$$

$$\text{wherein } A_P = \frac{\beta \cdot t_{TG1}}{2C_S^2} \quad (4)$$

where $t_{TG1}$: high level period of $\phi_{TG1}$;
$\beta$: a device constant.

When $Q_S = 0$, Eq. (3) can be simplified as:

$$E_P(Q_S = 0) = \frac{1}{(1 + A_P Q_B)^2} \quad (3)'$$

At $t=t_3$, the pulses $\phi_{TG1}$ and $\phi_{TC}$ respectively have low and high levels. With this operation, the MOSFET Q1 is turned off, and the charge $(Q_S + Q_B)$ is transferred to the n+ region 402 (equivalent capacitance $Q_B$). With the above operations, fill-spill transfer is completed.

Subsequently, at $t=t_4$, the pulse $\phi_{TC}$ has a low level, and the potential at the n+ region 402 (equivalent capacitance $Q_B$) returns to the initial potential $V_1$. At this time, a portion of n+ region 402 having a potential lower than $V_1$ stores charge $Q_S$.

Finally, at $t=t_5$, a high level of pulse $\phi_{TG2}$ is applied to the electrode TG2, causing the channel 406 to assume a potential of $V_1$. As a result, only the signal charge $Q_S$, having a potential lower than $V_1$, the n+ region 402 (equivalent capacitance $Q_B$) is transferred to the n+ region 403 (equivalent capacitance $C_D$). This is referred to as skimming transfer, with a transfer loss $E_S$ given by the following equation during only intrinsic transfer limitation:

$$E_S = \frac{1}{1 + A_S Q_S} \quad (5)$$

$$\text{wherein } A_S = \frac{\beta' \cdot t_{TG2}}{2C_B^2} \quad (6)$$

where $t_{TG2}$: high level period of $\phi_{TG2}$;
$\beta'$: a device constant.

With the above operations, one charge priming transfer cycle, i.e., the combination of a fill-spill transfer and a skimming transfer, is completed.

During charge priming transfer (referred to as CPT hereinafter), charge $Q_S$ is transferred from large capacitance $C_S$ to small capacitance $C_D$. This means that the potential at the n+ region 401 can be set from the n+ region 403.

It is necessary to consider how small the transfer loss of Eqs. (3) and (5) can be set to determine the operation of the CPT structure.

Prior to considering the transfer loss, let us partially differentiate Eq. (3) with respect to $Q_B$:

$$\frac{\partial E_P}{\partial Q_B} = \frac{-A_P[2 + A_P(Q_S + 2Q_B)]}{[1 + A_P(Q_S + 2Q_B) + A_P^2(Q_S + Q_B)Q_B]^2} < 0 \quad (7)$$

From Eq. (7), when $Q_B$ increases, $E_P$ decreases. This means that $Q_S$ is regarded as a portion of $Q_B$ so as to be equivalent to the variation of $Q_B$; therefore, there is a possibility that $E_P$ can be modulated by $Q_S$.

Assuming that $Q_S = 0$, Eq. (7) is simplified as Eq. (8):

$$\frac{\partial E_P}{\partial Q_B}(Q_S = 0) = \frac{-2A_P}{(1 + A_P Q_B)^3} \quad (8)$$

From Eqs. (3)' and (8), when $E_P \leq 1/10$ (which can be readily achieved), $\partial E_P / \partial Q_B$ nearly equals 0, and it will be understood that the effect of modulation of $E_P$ by $Q_S$ can be neglected.

Now consider Eq. (5). Since the skimming transfer loss $E_S$ shown by Eq. (5) depends on signal charge $Q_S$, there is a significant problem of how much the loss $E_S$ can be reduced when the signal charge $Q_S$ is small.

While $C_S > C_B > C_D$, assuming that $C_S = 10 \times C_B$, $\beta \approx \beta'$, and $t_{TG1} \approx t_{TG2}$, then we obtain $A_S \approx 10^2 A_P$. Assuming $E_P (Q_S = 0) = 0.1$ when $Q_B/q = 10^6$, as can be most readily realized, $E_S \approx 0.1$ when $Q_S/Q10^4$; this value is too large for a transfer loss. If fill-spill transfer occurs between capacitances $C_B$ and $C_D$, in place of skimming transfer to reduce the transfer loss, uniform setting would be difficult even though the number of bias charges $Q_B'$ required is only between $10^2$ to $10^3$.

If $C_S = 10^2 \times C_B$, $A_S \approx 10^4 A_P$ would occur with a similar argument; therefore, even if $Q_S/q = 10^2$, $E_S \approx 0.1$, providing no problem as to transfer loss with skimming transfer. However, the internal bias $Q_B$ necessary for fill-spill transfer cannot be stored in capacitance $C_B$.

Let us consider Eq. (3)' which is a simplified form of Eq. (3). when considering $E_P = 0.1$ as a reference at $Q_B/q = 10^6$ which can be readily provided when the value of $Q_B/q$ is as much as $4 \times 10^6$, then $E_P = 0.01$, whereby there is no transfer loss problem in fill-spill transfer. However, it is difficult to find an optimal condition since the necessity of storing a large charge $Q_B$ in capacitance $C_B$ is contradictory to the necessity of reducing capacitance $C_B$ for skimming transfer loss reduction.

Consider a general incomplete transfer since fill-spill transfer in the CPD is an incomplete transfer with bias charges and skimming transfer is also an incomplete transfer without bias charges.

Generally speaking, the charge transfer occurring as FETs operate under a saturated condition is known as an incomplete transfer; transfer loss $\epsilon(t)$ in such an incomplete transfer is given by:

$$\epsilon(t) = dQ(t)/dQ_0 \tag{9}$$

wherein
Q(t): amount of untransferred charges;
$Q_0$: total amount of charge before transfer.

A differential equation relating to $\epsilon$ is as follows as related to charge $Q_2$, FIG. 4:

$$\epsilon = -\frac{C_B}{g_m} \cdot \frac{d\epsilon}{dt} + \frac{g_r}{g_m} \cdot \frac{C_B}{C_D} + \int_{V_{BO}}^{V_B} \frac{dC_B}{dQ_0} \cdot dV + \tag{10}$$

$$\int_{V_{BSO}}^{V_{BS}} \frac{dC_{BS}}{dQ_0} \cdot dV + \epsilon_{SS}\left(1 - \frac{1}{g_m} \cdot \frac{C_B}{C_{BS}} \cdot \frac{\partial I}{\partial V_{BS}}\right)$$

wherein
$g_m$: forward transmission conductance;
$g_r$: reverse transmission conductance;
$\epsilon_{SS}$: transfer loss due to surface level;
$C_{BS}$: effective interface (or surface) state capacitance of MOSFET $Q_2$;
$V_{BO}$: potential of $C_B$ when no charge to be transferred to $C_D$ is in $C_B$;
$V_{BSC}$: potential of $C_{BS}$ when no charge transferrable to $C_D$ is in $C_{BS}$;
$V_B$: potential of $C_B$;
$V_{BS}$: potential of $C_{BS}$.

A solution of Eq. (10) is:

$$\epsilon = \epsilon_i + \epsilon_D + \epsilon_C + \epsilon_{C,SS} + \epsilon_{i,SS} \tag{11}$$

wherein
$\epsilon_i$: transfer loss determined by the intrinsic transfer limit;
$\epsilon_D$: transfer loss determined by feedback effect (Dynamic Drain Conductance, referred to as DDC hereinafter) from capacitance $C_D$ to capacitance $C_B$;
$\epsilon_C$: transfer loss determined by modulation of storing capacitance $C_B$ by signal charges;
$\epsilon_{C, SS}$: transfer loss due to modulation of interface (or surface) state capacitance $C_{BS}$ by the signal charges;
$\epsilon_{i, SS}$: transfer loss due to intrinsic transfer limitation through interface (or surface) state.

Results of each term of Eq. (11) are as follows:

$$\epsilon_i = \exp\left[-\int_0^{t_{TG2}} \frac{g_m}{C_B} \cdot dt\right] \tag{12}$$

-continued $$\epsilon_D = \frac{g_r}{g_m} \cdot \frac{C_B}{C_D} \tag{13}$$

$$\epsilon_C = Q_S \cdot \left(\frac{1}{C_B} \cdot \frac{dC_B}{dQ_0}\right) \tag{14}$$

$$\epsilon_{C,SS} = Q_{SS} \cdot \left(\frac{1}{C_{BS}} \cdot \frac{dC_{BS}}{dQ_0}\right) \tag{15}$$

$$\epsilon_{i,SS} = \epsilon_{SS} \cdot \left(1 + \frac{C_B}{C_{ch}}\right) \tag{16}$$

wherein
$Q_{SS}$: total charges within interface (or surface) state;
$C_{ch}$: sum of gate oxide film capacitance and capacitance between channel and substrate.

Since $\epsilon_{i,SS} < < \epsilon_{C,SS}$, $\epsilon_{i,SS}$ is ignored hereinafter.

Among the above transfer losses, it can be readily proved that Eq. (12) is equivalent to Eq. (5).

Namely, when we use the following equations by a linear approximation using a rectangular transfer pulse, $$g_m \simeq dI/dV_B,$$

$$dt \simeq (C_B/I)dV_B$$

then Eq. (12) is rewritten as:

$$\epsilon_i \simeq I(t)/I_0 = dQ(t)/dQ_0$$

Therefore, the square law V-I characteristic of a MOSFET is exhibited.

$$I = \frac{\beta}{2}\left(\frac{Q}{C_B}\right)^2 = \frac{\beta}{2}(V_B^*)^2 \tag{17}$$

$$\beta = \left(\frac{W}{L}\right) \cdot \mu \cdot C_G \tag{18}$$

wherein
W: channel width;
L: channel length;
$\mu$: mobility;
$C_G$: gate capacitance at transfer channel;
$V_B^*$: potential at channel entrance.

Therefore, we obtain:

$$I = -\frac{dQ}{dt} = \frac{\beta}{2}\left(\frac{Q}{C_B}\right)^2$$

Solving the above equation, we obtain Eq. (5).

To further expand Eqs. (12) through (16), it is necessary to consider $g_m$ and $g_r$. Since $V_B$ is not generally equal to $V_B^*$, $$dV_B/dV_B^* = (1 + kT/qV_B^*) \tag{19}$$

Since:

$$g_r = -\frac{\partial I}{\partial V_D} = -\frac{I}{\beta}\left(\frac{d\beta}{dV_D}\right) = I\left(\frac{1}{L_{G2}} \cdot \frac{dL_{G2}}{dV_D}\right) \tag{20}$$

$$g_m = \frac{\partial I}{\partial V_B} = \frac{\partial I}{\partial V_B^*} \cdot \frac{\partial V_B^*}{\partial V_B} = \beta \cdot V_B^* \cdot \left(\frac{\partial V_B^*}{\partial V_B}\right) \quad (21)$$

wherein $L_{G2}$: channel length of MOSFET Q2,

Eq. (13) is rewritten as:

$$\epsilon_D = \frac{C_B}{C_D} \cdot \frac{V_B^*}{2} \left(1 + \frac{kT}{qV_B^*}\right) \cdot \left(\frac{1}{L_{G2}} \cdot \frac{dL_{G2}}{dV_D}\right) \quad (13)'$$

Eqs. (14) and (15) represent transfer losses due to the charge capacitance modulation; since such transfer loss is equivalent to channel length modulation effect, these losses are expressed by:

$$\epsilon_C = \frac{C_{G2} V_B^*}{C_D} \cdot \left(\frac{1}{L_{G2}} \cdot \frac{dL_{G2}}{dV_D}\right) \quad (14)'$$

wherein $C_{G2}$: gate capacitance.

$$\epsilon_{C,SS} = \frac{Q_{SS}}{C_D} \cdot \left(\frac{1}{L_{G2}} \cdot \frac{dL_{G2}}{dV_D}\right) \quad (15)'$$

From Eqs. (13)' to (15)', the transfer losses $\epsilon_D$, $\epsilon_C$, $\epsilon_{C,SS}$ are determined by a feedback term:

$$\left(\frac{1}{L_{G2}} \cdot \frac{dL_{G2}}{dV_D}\right),$$

known as a DDC effect.

Next, applying Eq. (9) to MOSFET Q₁ of FIG. 4, transfer losses in connection with fill-spill transfer are obtained in the same manner as in the case of MOSFET Q₂. This case differs from skimming transfer in that internal bias charges Q_B exist; transfer losses due to the internal bias charges are given as follows in correspondence with Eqs. (12), (13)' to (15)' (portions corresponding to fill-spill transfer are indicated by):

$$\tilde{\epsilon}_i = \exp\left[-\int_0^{t_{TG1}} \frac{\tilde{g}_m(1 + K)}{C_S} dt\right] \quad (22)$$

$$\tilde{\epsilon}_D = \frac{C_S}{C_B} \cdot \frac{V_S^*}{2} \left(1 + \frac{kT}{qV_S^*}\right) \cdot \left(\frac{1}{L_{G1}} \cdot \frac{dL_{G1}}{dV_B}\right) \quad (23)$$

$$\tilde{\epsilon}_C = \frac{C_{G1} \cdot V_S^*}{C_B} \cdot \left(\frac{1}{L_{G1}} \cdot \frac{dL_{G1}}{dV_B}\right) \quad (24)$$

$$\tilde{\epsilon}_{C,SS} = \frac{Q_{SS}}{C_B} \cdot \left(\frac{1}{L_{G1}} \cdot \frac{dL_{G1}}{dV_B}\right) \quad (25)$$

where

K indicates the effect of $Q_B$ as an equivalent and representing an improved effect of $\tilde{g}_m$ $V_S^*$: potential at channel entrance, having a relationship similar to Eq. (17) with $V_S$;

$L_{G1}$: channel length;

$C_{G1}$: gate capacitance.

From Eqs. (23) to (25), it will be understood that the transfer losses $\tilde{\epsilon}_D$, $\tilde{\epsilon}_C$, $\tilde{\epsilon}_{C,SS}$ are determined, even in the case of fill-spill transfer, by a feedback term:

$$\left(\frac{1}{L_{G1}} \cdot \frac{dL_{G1}}{dV_D}\right)$$

which is known as DDC effect.

From Eqs. (20) and (21), we obtain:

$$\frac{1}{L_{G2}} \cdot \frac{dL_{G2}}{dV_D} = \frac{\tilde{g}_r}{\tilde{g}_m} \cdot \frac{2}{V_B^*} \cdot \left(1 + \frac{kT}{qV_B^*}\right)^{-1} \quad (26)$$

$$\frac{1}{L_{G1}} \cdot \frac{dL_{G1}}{dV_B} = \frac{\tilde{g}_r}{\tilde{g}_m} \cdot \frac{2}{V_S^*} \cdot \left(1 + \frac{kT}{gV_S^*}\right)^{-1} \quad (27)$$

From the above, the DDC effect is determined by $(g_r/g_m)$ and $(\tilde{g}_r/\tilde{g}_m)$.

Therefore, it is also understood that transfer losses of any types are determined by $(1/g_m)$ and $(1/\tilde{g}_m)$ or by $(g_r/g_m)$ and $(\tilde{g}_r/\tilde{g}_m)$, where the contributions of $g_m$ and $\tilde{g}_m$ are great. Similarly, the contributions of $g_r$ and $\tilde{g}_r$ are great. This means that it is desired to increase $g_m$ and $\tilde{g}_m$ and reduce $g_r$ and $\tilde{g}_r$ to reduce the transfer losses to a negligible extent. This indicates that it is desired to have FETs with ideal saturation characteristics and large $g_m$.

In addition, in solid state imaging devices, high-density is required for achieving miniaturization and providing high resolution, but such high-density is difficult to achieve because it causes a reduction in sensitivity. For this reason, solid state imaging devices having high multiplying sensitivity factors are desirable.

Conventional devices having high sensitivity multiplying factors are obtained by replacing photodiodes with phototransistors. Such phototransistors are formed as bipolar transistors (BPT) or field effect transistors (FET). In addition, a solid state imaging device using static induction transistors (SIT) having characteristics better than a BPT or a FET has been proposed in Japanese patent provisional publication Nos. 58-105672, 59-45781. When an SIT is used as a phototransistor, a device having a high sensitivity multiplying factor having inherent high $g_m$ (transconductance) can be obtained. However, since an SIT exhibits unsaturated V-I characteristics, similar to those of a vacuum tube triode, an undesirable feedback (dynamic drain conductance (DDC) effect occurs when the device is used for charge storing. Thereby, the gate potential barrier is modulated, which introduces a problem of the multiplying factor varying depending on the intensity of incident light.

Furthermore, it is difficult to have high sensitivity by sensitivity multiplication unless there is substantial removal of fixed pattern noise (FPN) occurring due to geometrical nonuniformity (such as photolithographic variations) and electrical nonuniformity (such as variations in threshold voltage or storage capacitances) of elements forming a light-receiving portion.

The above-described SITs are further described in the following documents:

(1) Nishizawa et al: IEEE Trans. Vol. ED-22, No. 4 (1975), "Field-Effect Transistor Versus Analog Transistor" (pages 185-197) which discusses the difference in operation between an FET and an SIT.

(2) Mochida et al: IEEE Trans. Vo. ED-25, No. 7 (1978), "Characteristics of Static Induction Transistor" (pages 761-767) which shows clearly that an ideal limit of an FET is an SIT.

(3) Ohmi et al: IEEE Trans. Vo. ED-27, No. 3 (1980), "Punching Through Device and Its Integration" (pages 536-545) which shows clearly the saddle point potential barrier characteristics inherent to an SIT.

However, the above-mentioned problems are left unsolved in these documents.

SUMMARY OF THE INVENTION

The present invention has been developed to remove the above-described drawbacks inherent to the conventional SITs.

It is, therefore, a primary object of the present invention to provide a new and useful active element, named Shielding Ideal-Saturated Operation Static Induction Transistor (SISO-SIT) having large transconductance and ideal saturated voltage-current characteristics. The SISO-SIT comprises first and second gate regions which pinch a channel between the gate response. The first and second gate regions are respectively close to the source and drain regions and respectively farther from the drain and source regions. The channel is formed as a charge carrier passage between a source region and a drain region. A potential barrier (a region including this barrier is referred to as an intrinsic gate region) is formed in a portion of the channel closest to the first gate region. The geometry of the transistor is such that the product of the resistance, $r_s$, from the source region to the intrinsic gate region and the intrinsic transconductance, $g_m$, is equal to or smaller than 1. Furthermore, to achieve electrostatic shielding, various portions are sized so that either (a) the distance, $l_{GG}$, between the first gate region and the second gate region is larger than the channel width $W_{G2}$ between the narrowest region of channel width $W_{G2}$ (determined by the second gate region). If the channel width $W_{G2}$ is constant over the channel length, the distance $l_{G2}$ between a portion of the second gate closest to the source region and the drain region exceeds the channel width $W_{G2}$, and the drain region is larger than the channel width $W_{G2}$.

A further object of the present invention is to provide a tunnel transistor named Shielding Ideal-Saturated Operation and Ballistic Tunnel Transistor (SISO-BATT) having saturated voltage-current characteristics with the application of an SISO-SIT to tunnel transistors. The structure of the SISO-BATT is such that the source region of an SISO-SIT is a degenerate semiconductor, and a tunnel barrier is formed in the intrinsic gate region. Sizes of various regions are selected such that the carrier propagation distance $L_{DS}$ between the source region and the drain region and the mean free path $L_F$ are related by $L_F > L_{DS}$.

A still further object of the present invention is to provide a charge transfer device CPD using a plurality of SISO-SITs so it has an potential-setting function. The structure of the SISO-SIT is such that a drain region of a first SISO-SIT and a source region of a second SISO-SIT are common to each other so they operate as a charge storing region. A large capacitance $C_1$ connected to the source region of the first SISO-SIT, a small capacitance $C_3$ connected to the drain region of the second SISO-SIT, and a capacitance $C_2$ of the charge storing region are selected so $C_1 < C_2 < C_3$.

A still further object of the present invention is to provide a solid state imaging device having a sensitivity multiplying function using SISO-SITs as phototransistors. The structure of such an SISO-SIT is such that a gate region is used as a hole or electron storing region. The charged carriers are generated in response to incident light and are multiplied by the source region as a function of the number of charged carriers collected at the drain region.

BRIEF DESCRIPTION OF THE DRAWINGS

The object and features of the present invention will become more readily apparent from the following detailed description of the preferred embodiments taken in conjunction with the accompanying drawings in which:

FIGS. 5A, 5B, 5C, 5D and 5E are respectively a top plan view of a junction type SISO-SIT of a first embodiment according to the present invention, a cross-sectional view taken along a line A—A' in the direction of a channel, a cross-sectional view taken along a line C—C' in a direction normal to the channel, a cross-sectional view taken along a line D—D' in a direction normal to the channel, and a symbol thereof;

FIGS. 8A, 8B, 8C and 8D are respectively a top plan view of a tunnel transistor, which is another embodiment of the present invention, a cross-sectional view taken along a line A—A' in the direction of the channel, a cross-sectional view taken along a line B—B' in a direction normal to the channel, and a cross-sectional view taken along a line C—C' in a direction normal to the channel;

FIGS. 18A through 18E are respectively a top plan view of an SISO-SIT type phototransistor with electron storing operation, a horizontal cross-sectional view taken along a line a-a', a horizontal cross-sectional view taken along a line b—b', a vertical cross-sectional view taken along a line c—c', and a vertical cross-sectional view taken along a line d—d';

FIG. 19 is a structural diagram of an element using an SISO-SIT type phototransistor for storing electrons;

FIGS. 20A through 20E are respectively a top plan view of an SISO-SIT of another embodiment of the present invention, a cross-sectional view taken along a line a—a', a cross-sectional view taken along a line b—b', a cross-sectional view taken along a line c—c', and a symbol for the transistor of FIGS. 20A through 20D;

The same or corresponding elements and parts are designated by like reference numerals throughout the drawings.

DETAILED DESCRIPTION OF THE INVENTION

Figure 1:
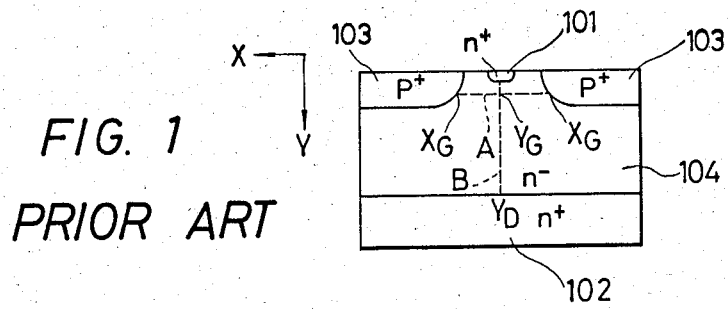
FIG. 1 is a cross-sectional view of a conventional vertical SIT.
Figure 2:
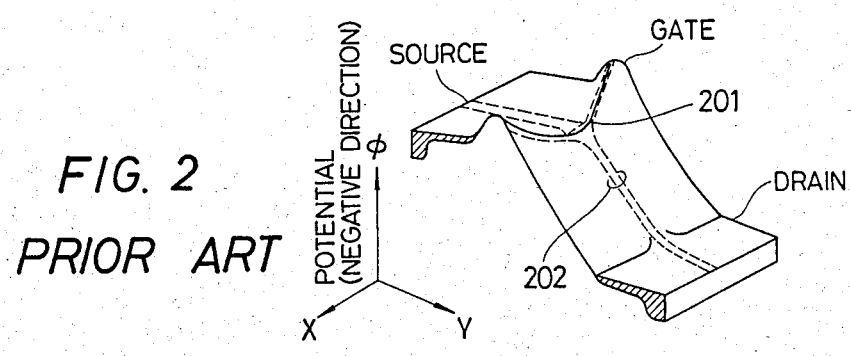
FIG. 2 is a diagram of a saddle point potential barrier for describing an operating principle of an SIT.
Figure 3:
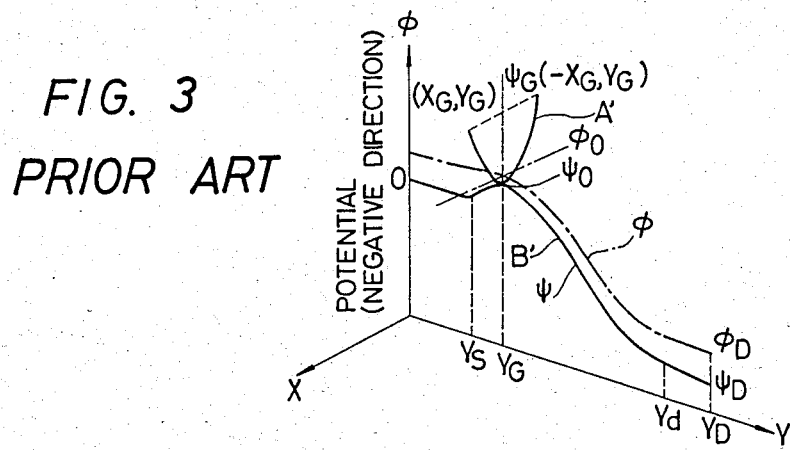
FIG. 3 is a diagram of potential distribution in a SIT.
Figure 4A:
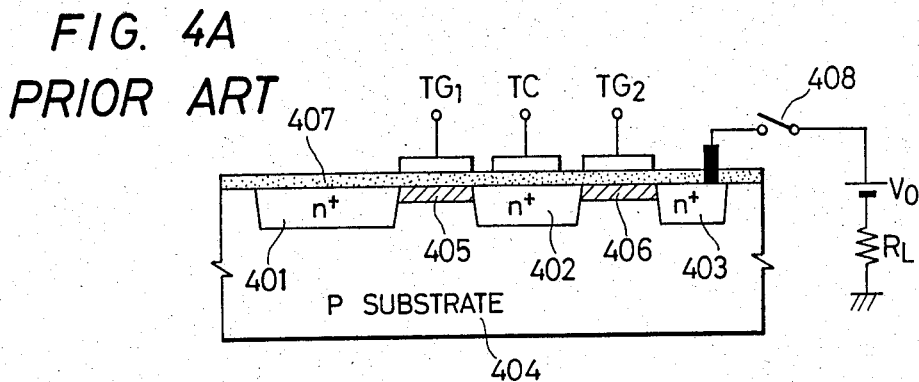
FIGS. 4A, 4B and 4C are respectively a cross-sectional view of a conventional charge priming transfer device (CPD), its equivalent circuit, and a pulse timing chart.
Figure 4B:
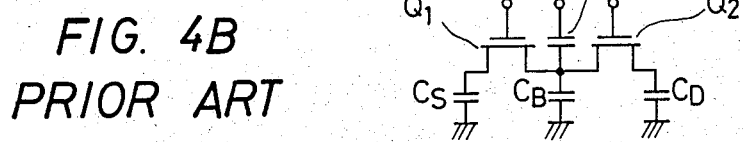
Figure 4C:
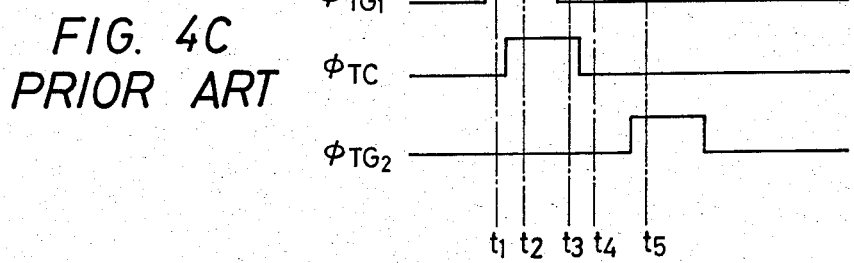

Referring now to FIGS. 5A through 5E, an SISO-SIT (Shielding Ideal-Saturated Operation Static Induction Transistor) of the junction gate type formed horizontally is shown as an embodiment of the present invention. More specifically, FIGS. 5A, 5B, 5C, 5D and 5E are respectively a top plan view of a junction type SISO-SIT of a first embodiment according to the present invention, a cross-sectional view taken along a line A—A' along the channel longitudinal axis, a cross-sectional view taken along a line C—C' in a direction normal to the channel longitudinal axis, a cross-sectional view taken along a line D—D' in a direction normal to the channel longitudinal axis, and a symbol of the device illustrated in FIGS. 5A through 5D.

In FIGS. 5A to 5E, on a P substrate 501, having an impurity concentration $N=10^{12}$ to $10^{17}$ cm$^{-3}$ is formed an n$^-$ well 502 ($N=10^{12}$ to $10^{17}$ cm$^{-3}$). In the surface of the n$^-$ well 502 are formed an n$^+$ source region 503 ($N=10^{17}$ to $10^{20}$ cm$^{-3}$), an n$^+$ drain region 504 ($N=10^{12}$ to $10^{17}$ cm$^{-3}$), a p$^+$ first gate (G1) region 505 ($N=10^{12}$ to $10^{17}$ cm$^{-3}$), and a p$^+$ second gate (G2) region 506 ($N=10^{12}$ to $10^{17}$ cm$^{-3}$). Source electrode 507, drain electrode 508, first gate electrode 509, and second gate electrode 510 respectively contact corresponding regions through contact windows in insulating film 511.

In FIGS. 5A and 5B, circle 512 indicates a region where a saddle point potential barrier formed by a p$^+$ region 505 of the first gate exists; this region is referred to as an intrinsic gate region 512 hereinafter.

Figure 6:
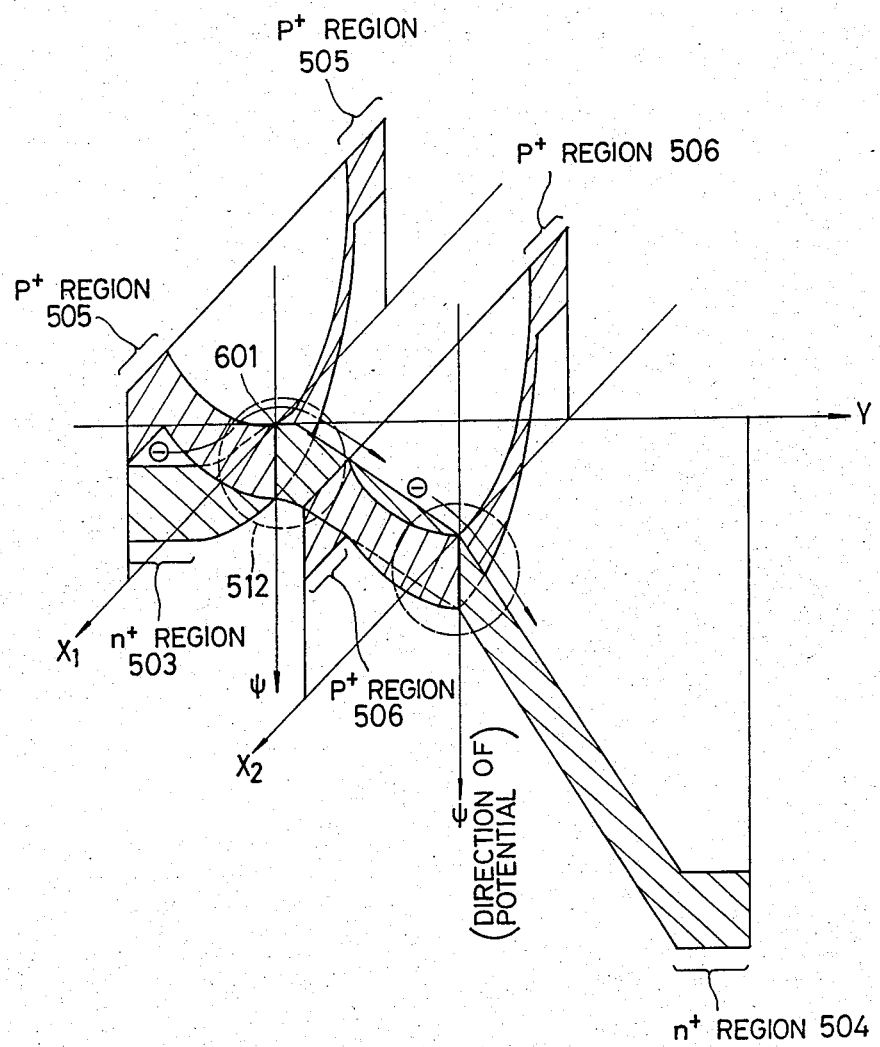
FIG. 6 is an energy band diagram showing the operating principles of an embodiment of the present invention.
Figure 7C:
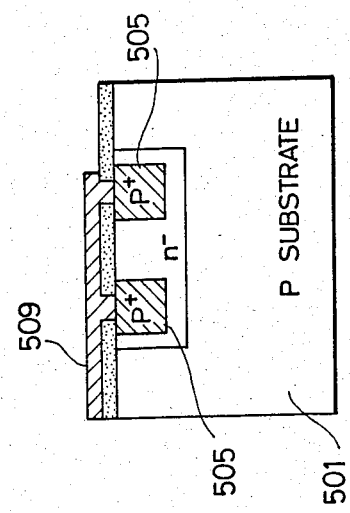
FIGS. 7A, 7B, 7C and 7D are respectively a top plan view of a modification of the first embodiment, a cross-sectional view taken along a line A—A' in the direction of channel, a cross-sectional view taken along a line C—C' in a direction normal to the channel, and a cross-sectional view taken along a line D—D' in a direction normal to the channel.
Figure 7D:
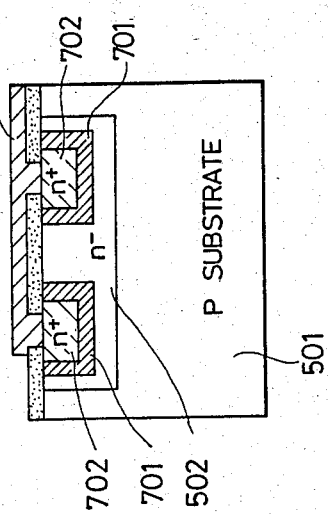
Figure 7A:
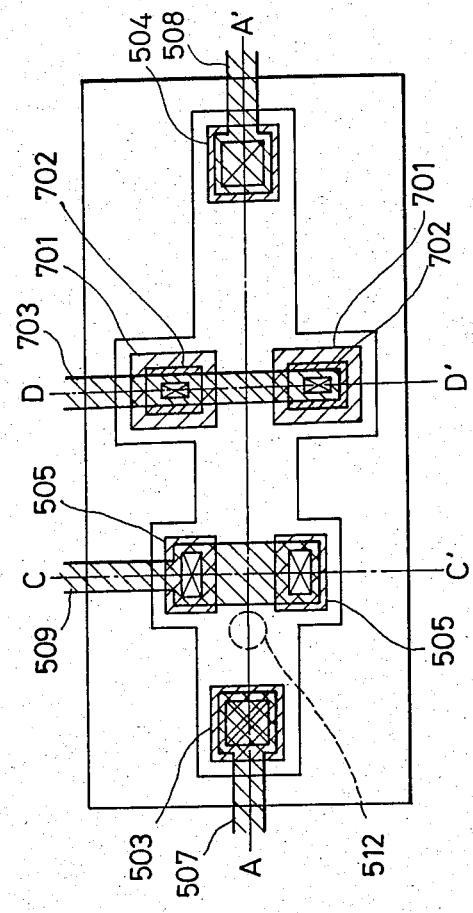
Figure 7B:
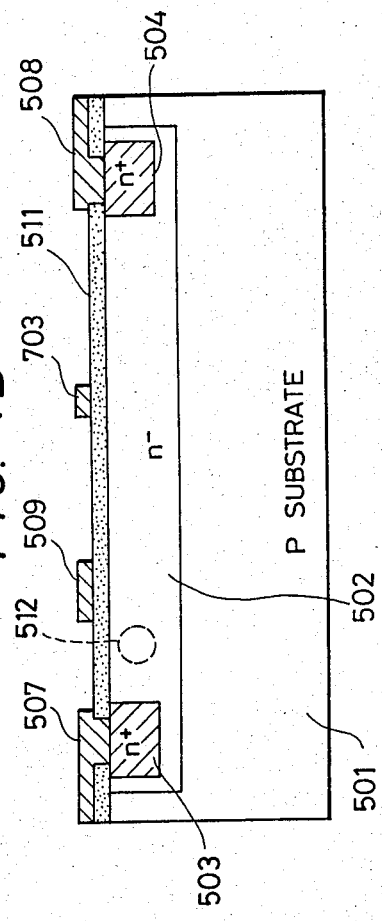

Space $W_{G1}$ between a pair of p$^+$ regions 505 of the first gate is narrower than other channel portions. Thereby, a saddle point potential barrier 601 (see FIG. 6) is easily provided in the intrinsic gate region 512 as shown in FIG. 6. The number of electrons injected from n$^+$ source region 503 to drain region 504 is controlled by the height of potential barrier 601. By setting the distance between n$^+$ source region 503 and the intrinsic gate region 512 to a sufficiently small value, the series resistance, r$_S$, between the source and intrinsic gate regions becomes extremely small whereby the product of r$_S$ and transconductance g$_m$ is 1 or less and a large g$_m$, which is inherent to SIT, is inherently provided. Under this condition, the potential barrier 601 of the intrinsic gate region 512 is affected by p$^+$ first gate region 505 and p$^+$ second gate region 506. By fixing the potential of the p$^+$ second gate region 506, the number of electrons injected from n$^+$ source region 503 to n$^+$ drain region 504 is controlled in response to an input voltage applied to the p$^+$ first gate region 505.

Furthermore, the space $W_{G2}$ between a pair of spaced p$^+$ AC grounded second gate regions 506 is less than the distance l$_{GG}$ between the closest portions of the first and second gate regions 505 and 506; i.e.:

$$l_{GG} > W_{G2}. \tag{28}$$

With this arrangement, the voltage of n$^+$ drain region 504 is completely electrostatically shielded and does not affect the potential barrier 601 of the intrinsic gate region 512. In this way, the potential barrier 601 of the intrinsic gate region 512 is controlled by the static induction effect of the voltage applied to the p$^+$ first gate region 505 while a saturated current characteristic with a high g$_m$, as in an unsaturated SIT, is attained. This is because the potential barrier 601 does not depend on the drain voltage due to the electrostatic shield effect of the p$^+$ second gate region 506.

As described above, the FIG. 5 embodiment has a saturated current-voltage characteristic with respect to the drain voltage, with the high g$_m$ of an unsaturated SIT. These characteristics are attained since the second gate is between the drain and first gate which controls the potential of an intrinsic gate potential barrier.

Although control is provided by applying a reverse voltage to the p$^+$ region forming the first and second gates in the FIG. 5 embodiment, it is possible to pinch off the channel corresponding to the n$^-$ well region by only diffusion potential. In such an instance a forward bias is applied to the gate to establish the enhancement mode.

In the embodiment of FIG. 7 the second gate is formed by a floating p$^+$ region 701 surrounding an n$^+$ region 702 and the second gate 703 is connected to the n+ region 702 as shown in FIG. 7. This has the advantage of enabling a wide range of setting voltages to be applied to the second gate 703.

Although the above embodiments have been described in connection with an "n" channel SISO-SIT using a "p" substrate, the present invention can be applied to a "p" channel SISO-SIT using an "n" substrate. In addition, the substrate material may be compounds such as GaAs, InSb and so on to provide faster operation than is attained with Si which can also be used. Furthermore, the multi-channel structure may be most advantageous for devices handling large current.

The device is not limited to a horizontal type structure; the same results may also be obtained with vertical structure.

A second embodiment of the present invention, applicable to an SISO-SIT tunnel transistor is described. This tunnel transistor is referred to as Shielding Ideal-Saturated Operation and Ballistic Tunnel Transistor (SISO-BATT) hereinafter.

FIGS. 8A, 8B, 8C and 8D are respectively a top plan view of a tunnel transistor of the second embodiment of the present invention, a cross-sectional view taken along a line A—A' in the channel direction, a cross-sectional view taken along a line B—B' in a direction normal to the channel, and a cross-sectional view taken along a line C—C' in a direction normal to the channel.

In FIGS. 8A to 8D, on a P substrate 801 (impurity concentration $N=10^{12}$ to $10^{17}$ cm$^{-3}$) is formed an n$^-$ well 802 ($N=10^{12}$ to $10^{17}$ cm$^{-3}$). In the surface of the n$^-$ well 802 are formed a p$^{++}$ source region 803 ($N=10^{19}$ to $10^{21}$ cm$^{-3}$), an n$^{++}$ drain region 804 ($N=10^{19}$ to $10^{21}$ cm$^{-3}$), a p$^+$ first gate (G1) region 809 ($N=10^{17}$ to $10^{20}$ cm$^{-3}$), and a second gate (G2) p$^+$ region 811 ($N=10^{17}$ to $10^{20}$ cm$^{-3}$). Source electrode 807, drain electrode 808, first gate electrode 810, and second gate electrode 812 respectively contact corresponding regions through contact windows in insulating film 805.

In FIGS. 8A and 8B, a tunnel barrier exists at circular region 806, referred to hereafter as a tunnel gate region 806. As shown in FIG. 8A, the voltage control characteristic of the first gate and the second gate with respect to channel voltage can be improved by reducing the lengths $W_{G1}$ and $W_{G2}$ of the p$^+$ first and second gate regions 809 and 811 as much as possible. The tunneling probability of the tunnel barrier of the tunnel gate region 806 is determined by the first gate voltage and the second gate voltage. With the second gate AC grounded an input signal voltage applied to the p$^+$ region 809 of the first gate controls the number of carriers injected from p$^{++}$ source region 803 into n$^{++}$ drain region 804. Furthermore, the length $W_{G2}$ of the AC grounded p$^+$ second gate region is selected to be less than $l_{GG}$, the distance between the p$^+$ first gate region 809 and the p$^+$ second gate region 811.

The influence of the voltage of n$^{++}$ drain region 804 is electrostatically shielded by the p$^+$ second gate region 811.

Figure 9A:
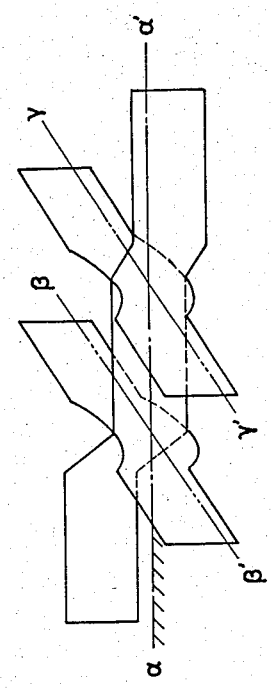
FIGS. 9A and 9B are energy band diagrams, assuming a thermal equilibrium state and an operating state wherein the drain is formed by a degenerate semiconductor.
Figure 9B:
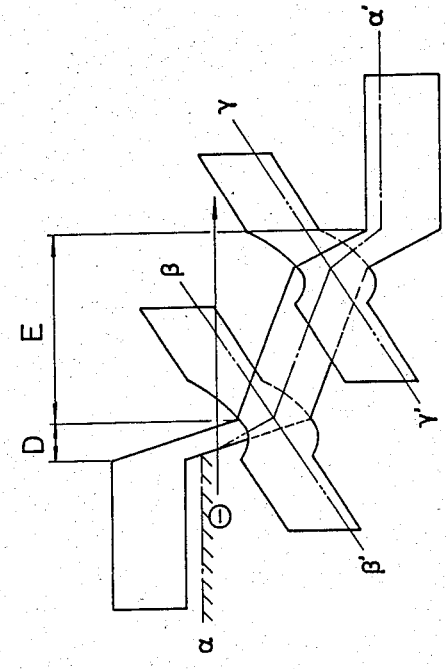

FIGS. 9A and 9B are energy band diagrams of the above-mentioned embodiment in the thermal equilibrium and operating states, respectively. In these diagrams, lines $\alpha$—$\alpha'$ (corresponding to Fermi-level $E_F$), $\beta$—$\beta'$ and $\gamma$—$\gamma'$ respectively correspond to lines A—A', B—B' and C—C' of FIG. 8A.

In this embodiment, p$^{++}$ region 803 is in degenerate state and the Fermi-level $E_F$ thereof lies in the valance band, while the n$^{++}$ region 804 is also in the degenerated state and has a Fermi-level $E_F$ in the conduction band. Since the n$^-$ region 802 and p$^+$ region 809 are in the non-degenerated state, the Fermi-level $E_F$ thereof lies in the forbidden band. FIG. 9B is an energy band diagram while voltages $V_{G1}$ and $V_{G2}$ are respectively applied to the first and second gates with a reverse bias voltage $V_{DS}$ being applied across the source and drain. At this time, a tunnel barrier is formed in the tunnel gate region 806 between the p$^{++}$ region 803 and the n$^-$ region 802. As a result, electrons in the valance band of the p$^{++}$ region 803 tunnel into the n$^-$ region 802. In other words, tunneling occurs at the tunnel barrier portion D, FIG. 9B. The electrons tunneling into the n$^-$ region 802 travel without diffusion in the n$^-$ region 802 to reach the conduction band of the n$^{++}$ region 804 when the distance, $L_{DS}$, between the source and drain is less than the mean free path length, $L_F$, i.e., $$L_F > L_{DS}. \quad (30)$$

Therefore, nonscattering travelling takes place at a position E, FIG. 9B.

To prevent diffusion in the n$^-$ region 802, the impurity concentration should be as small as possible. The impurity concentration limit is the intrinsic semiconductor state. Assuming that the intrinsic semiconductor state is expressed by "i" a p$^{++}$in$^{++}$ structure for the source-drain path is more advantageous for high-speed operation than a p$^{++}$n$^-$n$^{++}$ structure.

As described in the above, since the tunneling probability at the tunnel gate region 813 is controlled by the applied voltage at the p$^+$ region 809 of the first gate and does not depend on drain voltage due to the electrostatic shield effect of the p$^+$ second gate region 811, a tunnel transistor having an ideal saturated characteristic is provided. Although control is carried out by applying a reverse voltage to the p$^+$ region forming the first gate and the second gate in this embodiment, enhanced control operation can also be readily attained by applying a forward voltage to the first and second gates by pinching off the channel portion (corresponding to an n$^-$ well region) with only a diffusion potential. The gate structure may be of the insulating type or the n$^{++}$ drain region 804 can be replaced with an n$^+$ non-degenerated region.

Figure 10A:
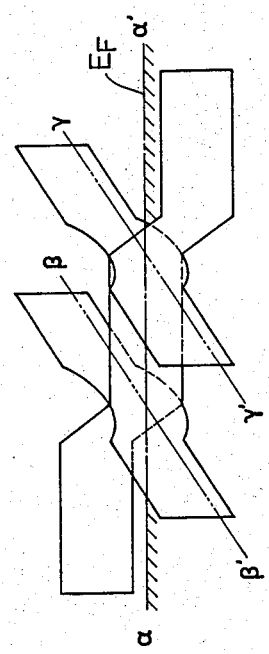
FIGS. 10A and 10B are energy band diagrams, assuming a thermal equilibrium state and an operating state wherein the drain is formed by a nondegenerate semiconductor.
Figure 10B:
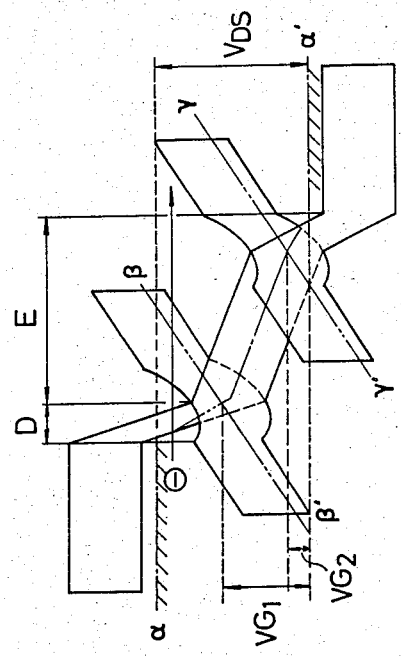

FIGS. 10A and 10B are energy band diagrams of such a case. Even if the polarity of the substrate and respective regions is entirely inverted, there would be no operating problem. Such a variety may be classified as follows:

| SOURCE | GATE | DRAIN | CARRIER |
|---|---|---|---|
| (1) p$^{++}$ region | p$^+$ region | n$^{++}$ region | electrons |
| (2) p$^{++}$ | p$^+$ | n$^+$ | electrons |
| (3) n$^{++}$ | n$^+$ | p$^{++}$ | holes |
| (4) n$^{++}$ | n$^+$ | p$^+$ | holes |

As described above, by providing a second gate between the drain and first gate, which controls tunnel probability at the tunnel barrier close to the source, to prevent the drain voltage from affecting the tunnel barrier, a tunnel transistor SISO-BATT having a saturated characteristic is provided. In addition, virtually in noise exists because the charged carrier tunnels without nondiffusion.

The present invention provides the same effect with either a horizontal or vertical construction. The device can be formed as either a junction or insulated gate structure.

Next is described a third embodiment, referred to as a Charge Priming Device (CPD) having enhanced potential setting function; the CPD is formed from two SISO-SITs.

FIGS. 11A through 11H are respectively a cross-sectional view of a charge priming transfer device, taken along the channel longitudinal axis, a top plan view of the same, a cross-sectional view taken along a line a—a', a cross-sectional view taken along a line b—b', a cross-sectional view taken along a line c—c', a cross-sectional view taken along a line d—d', an equivalent circuit, and a pulse timing chart;

In FIGS. 11A to 11H, on a P substrate 1101 (impurity concentration $N=10^{12}$ to $10^{17}$ cm$^{-3}$) is formed an n$^-$ well 1102 ($N=10^{12}$ to $10^{17}$ cm$^{-3}$), and in the surface of the n$^-$ well 1102 are formed an n$^+$ source region 1103 ($N=10^{17}$ to $10^{20}$ cm$^{-3}$), an n$^+$ drain region 1104 ($N=10^{17}$ to $10^{20}$ cm$^{-3}$), an n$^+$ region 1105 ($N=10^{17}$ to $10^{20}$ cm$^{-3}$), a p$^+$ region 1106 ($N=10^{17}$ to $10^{20}$ cm$^{-3}$), a p$^+$ region 1107 ($N=10^{17}$ to $10^{20}$ cm$^{-3}$), a p$^+$ region 1108 ($N=10^{17}$ to $10^{20}$ cm$^{-3}$), a p$^+$ region 1109 ($N=10^{17}$ to $10^{20}$ cm$^{-3}$). The charge storage capacitances $C_S$, $C_B$ and $C_D$ of n$^+$ region 1103, n$^+$ region 1104 and n$^+$ region 1105 are related so $C_S>C_B>C_D$ to achieve a CPD.

Figure 11A:
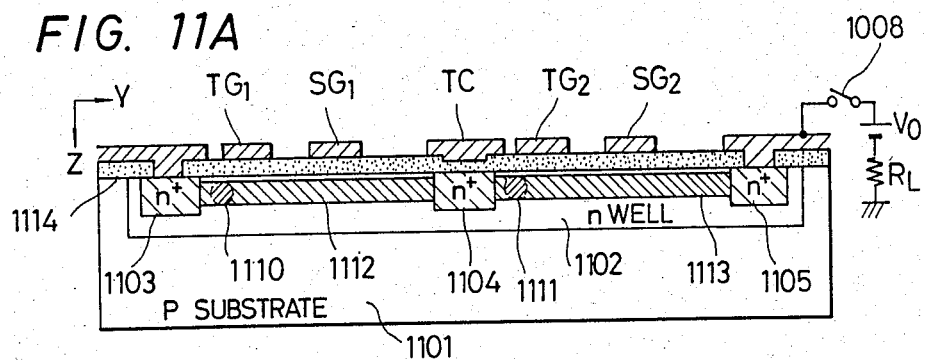
FIGS. 11A through 11H are respectively a cross-sectional view of a priming transfer device, which is an embodiment of the present invention, taken along a line in a direction of channel, a top plan view of the same, a cross-sectional view taken along a line a—a', a cross-sectional view taken along a line b—b', a cross-sectional view taken along a line c—c', a cross-sectional view taken along a line d—d', an equivalent circuit, an a pulse timing chart.
Figure 11B:
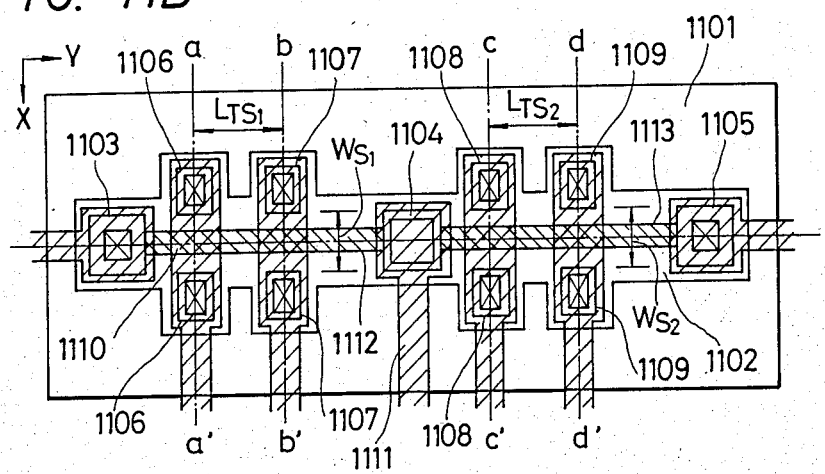
Figure 11C:
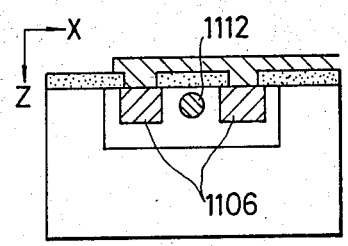
Figure 11D:
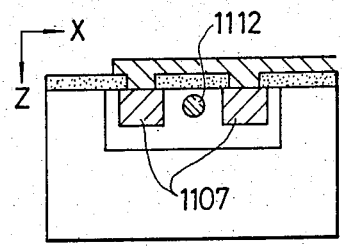
Figure 11E:
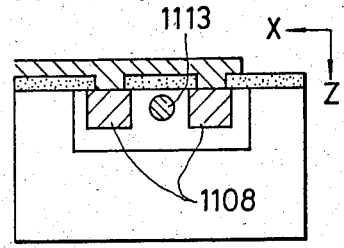
Figure 11F:
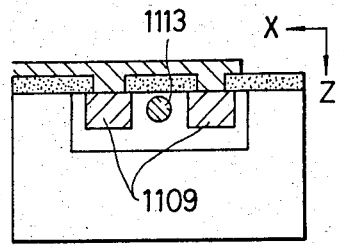
Figure 11G:
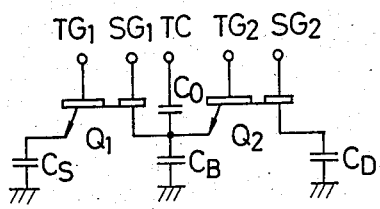
Figure 11H:
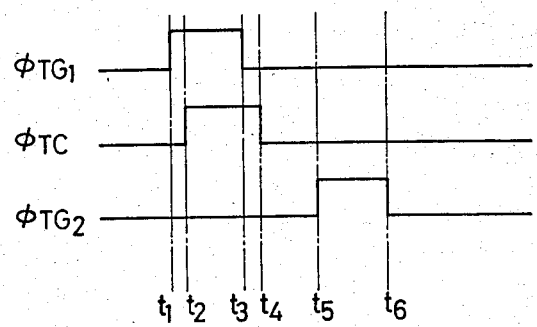

FIGS. 11A and 11B, the transfer gate electrode TG$_1$ is connected to the p$^+$ region 1106 via a contact hole in insulator 1114. Transfer gate electrode TG$_2$ is connected to the p$^+$ region 1108. Similarly, shielding gate electrode SG1 is connected to p$^+$ region 1107, while another shield gate electrode SG2 is connected to p$^+$ region 1109. Control electrode TC is capacitively coupled via insulator 1114 to n$^+$ region 1104.

Regions 1110 and 1111, FIGS. 11A and 11B, are locted where saddle point potential barriers, which are inherent to SIT, exist.

The layout, size, and impurity distribution are determined so that the formulae (31) and (32), infra, are satisfied.

The distance, $L_{TS1}$, between the p$^+$ region 1106 connected to the transfer gate electrode TG$_1$ and the p$^+$ region 1107 connected to the shielding gate electrode SG$_1$ is greater than the channel width, $W_{S1}$, which is determined by the p$^+$ region 1107, i.e., $$L_{TS1} > W_{S1}. \tag{31}$$

Similarly, the distance, $L_{TS2}$, between the p$^+$ region 1108 connected to the transfer gate electrode TG$_2$ and the p$^+$ region 1109 connected to the shielding gate electrode SG$_2$ is greater than the channel width, $W_{S2}$, which is determined by the p$^+$ region 1109, i.e., $$L_{TS2} > W_{S2}. \tag{32}$$

A channel 1112 between the n$^+$ region 1103 and the n$^+$ region 1104 is formed when a voltage is applied to the electrode TG1; this corresponds to SISO-SIT Q1 being turned on. A channel 1113 is formed between the n$^+$ region 1104 and the n$^+$ region 1105 when a voltage is applied to the electrode TG2; this corresponds to SISO-SIT Q2 being turned on.

Initial potential setting is established by coupling potential $V_0$ to n$^+$ region 1105 by closing switch 1108. After this, switch 1008 is opened during charge priming transfer. Resistor $R_L$ detects a signal while switch 1008 is closed. Shielding gate electrodes SG1 and SG2 are AC short-circuited.

The potential of the n$^+$ region 1104 is set to the barrier potential $V_{P2}$ of region 1111 in channel 1113; region 1111 is formed when SISO-SIT Q2 turns on in response to a voltage being applied to electrode TG2. Normally, $V_{P2} > V_0$.

Similarly, the potential of the n$^+$ region 1103 is set to a barrier potential $V_{P1}$ of region 1110 in channel 1112 which is formed when the SISO-SIT Q1 turns on in response to a voltage being applied to electrode TG1. Normally, $V_{P1} > V_{P2}$.

Actual signal charge transfer is carried out by effecting a charge priming transfer from the n$^+$ region 1103 to the n$^+$ region 1105. The operation is described hereinafter with reference to a pulse timing charge of FIG. 11H.

When a high level of a pulse $\phi_{TG1}$ is applied to the electrode TG1 at $t=t1$, the SISO-SIT Q1 turns on, causing an internal bias charge $Q_B$ to be injected from the equivalent capacitance $C_B$ of the n$^+$ region 1104 to the equivalent capacitance $C_S$ of the n$^+$ region 1103. Charge $Q_B = (V_{P1} - V_{P2}) \times C_B$, corresponding to the difference ($V_{P1} - V_{P2}$) between the potential VP2 of n$^+$ region 1104 and the barrier potential VP$_1$ of region 1110 of channel 1112. This is referred to as fill-in. If capacitor $C_S$ originally has a signal charge $Q_S$, the charge ($Q_S + Q_B$) now exists on capacitor $C_S$ due to fill-in.

Subsequently, at $t=t2$, a high level pulse $\phi_{TC}$ is applied to the electrode TC with pulse $\phi_{TG1}$ being maintained at high level. As a result, $\Delta V$ is superposed on the potential $V_{P2}$ of the n$^+$ region 1104 because of static induction through the capacitance Co of the insulator 1114 between the electrode TC and the n$^+$ region 1104; the potential at the n$^+$ region 1104 becomes $(V_{P2} + \Delta v) = V_3 (> V_{P1})$.

Therefore, charge ($Q_S + Q_B$) is transferred from the n$^+$ region 1103 (with an equivalent capacitance $C_S$) having a potential $V_{P1}$ to the n$^+$ region 1104 (equivalent capacitance $C_B$) having a deeper potential $V_3$. This is referred to as spill-out.

Operation including both the above-mentioned fill-in and spill-out is referred to as fill-spill transfer.

Under the above condition, formula (31) is satisfied as a feature of SISO-SIT, while the SISO-SIT Q1 has high $\tilde{g}_m$, as well as a saturated characteristic and a reduced $\tilde{g}_r$ since electrode SG1 is A.C. short-circuited. With the SISO-SIT Q1, $\tilde{g}_m$ has an increased value, which is larger by one or two orders of magnitude than that of a conventional MOSFET while $\tilde{g}_r$ has a decreased value which is smaller by one or two orders of magnitude than that of the conventional MOSFET. As a result, various transfer losses, evident from formulas (22) through (25), are drastically reduced.

Subsequently at $t=t3$, pulse $\phi_{TG1}$ changes to low level with the pulse $\phi_{TC}$ being maintained at high level; then SISO-SIT Q1 turns off, terminating fill-spill transfer.

At $t=t4$, the pulse $\phi_{TC}$ turns to a low level; therefore, the potential of the n$^+$ region 1104 (equivalent capacitance $C_B$) returns to the initially set value $V_{P2}$. At this time, the only signal charge $Q_S$ is at the portion of n$^+$ region 1104 having a potential shallower than the potential $V_{P2}$.

After this, at $t=t5$, when pulse $\phi_{TG2}$ having a high level is applied to the electrode TG$_2$, the SISO-SIT Q$_2$ turns on, whereby only the signal charge $Q_S$ within the n$^+$ region 1104 (equivalent capacitance $C_B$) having a potential shallower than $V_{P2}$ is transferred to the n+ region 1105 (equivalent capacitance $C_D$). This is referred to as skimming transfer.

Under the above condition, formula (32) is satisfied as a feature of SISO-SIT, while the SISO-SIT Q2 has a high $g_m$ and a saturated characteristic, as well as a reduced $g_r$ since the electrode SG2 is A.C. short-circuited. The SISO-SIT Q2, has an increased $g_m$ which is larger by one or two orders of magnitude than that of a conventional MOSFET while $g_r$ has a decreased value which is smaller by one or two orders of magnitude than that of a conventional MOSFET. As a result, various transfer losses, evident from formulas (12), (13)', (14)' and (15)', are drastically reduced.

Subsequently at t=t6, pulse $\phi_{TG2}$ changes to a low level, to turn off SISO-SIT Q2 and terminate skimming transfer.

With the above operations one charge priming transfer cycle, i.e., the combination of fill-spill transfer and skimming transfer, is completed.

As described above, according to the above embodiment, since a priming transfer device is constructed by an SISO-SIT structure having high $g_m$ and ideal saturated characteristic, the transfer coefficient can be improved by one or two orders of magnitude. This largely contributes to the achievement of low noise devices since $Q_B$ can be made small; the structure also inherently has the low noise characteristics of an SIT.

The present invention is not limited to devices having junction gate structure electrodes TG1 and TG2 but may be applied to devices having MOS gate structure electrodes TG1 and TG2. This is readily provided by eliminating contact holes 1201 and 1202 in the insulator 1114, FIGS. 12A to 12F. Of course shielding electrodes SG1 and SG2 can be provided in an MOS structure.

Figure 13:
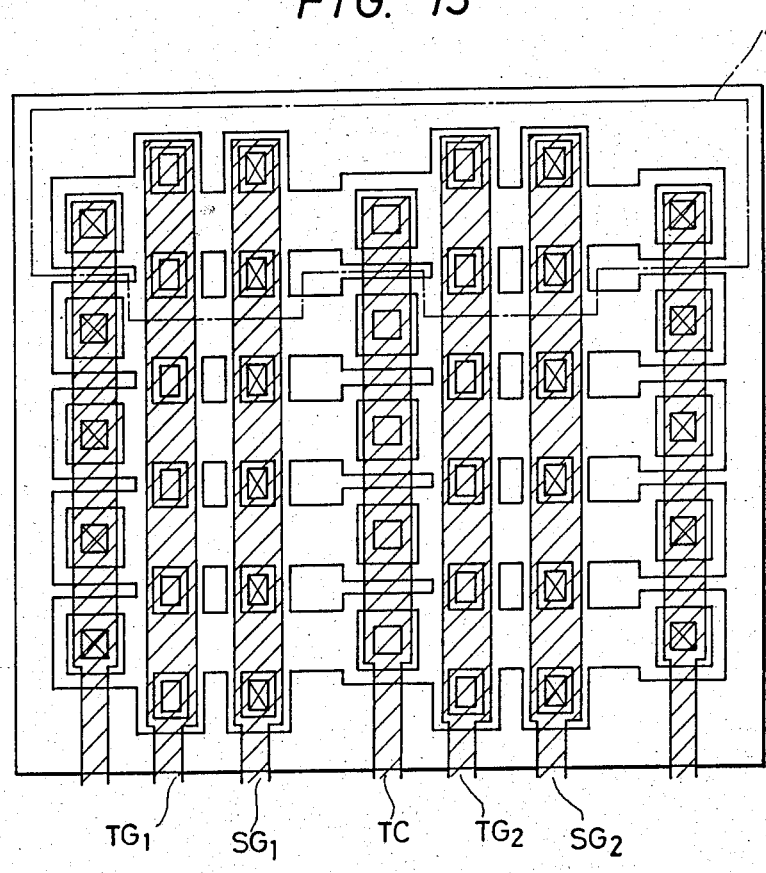
FIG. 13 is a top plan view of a priming transfer device including a plurality of structures of FIGS. 12A through 12F.
Figure 12A:
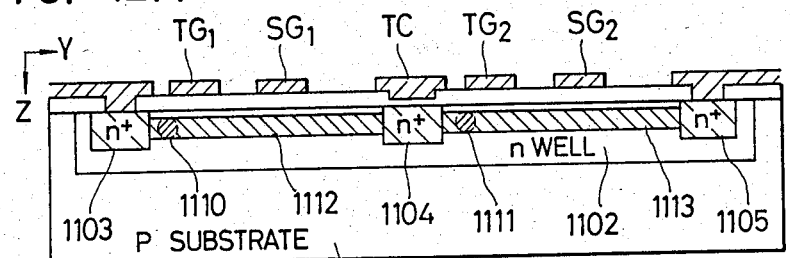
FIGS. 12A through 12F are diagrams of the states of the transfer gate of the device illustrated in FIGS. 11A through 11G, wherein the transfer gate TG1 and TG2 are formed by an MOS gate structure.
Figure 12B:
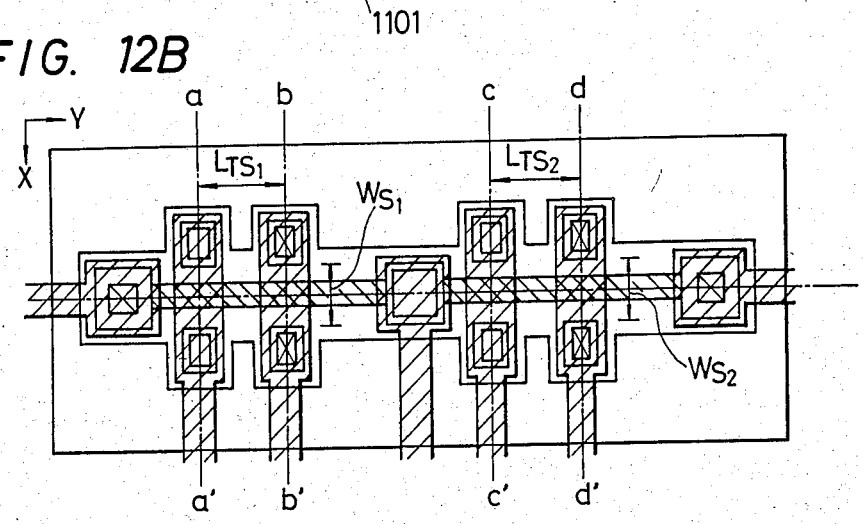
Figure 12C:
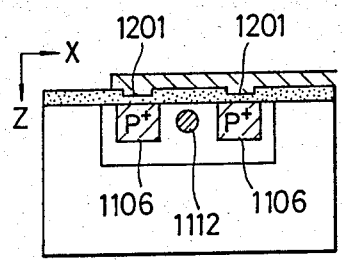
Figure 12D:
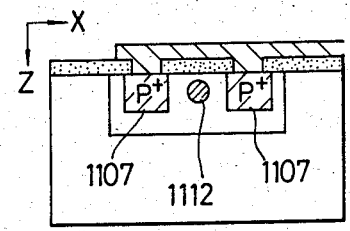
Figure 12E:
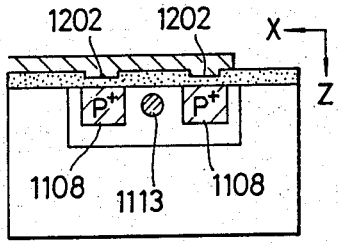
Figure 12F:
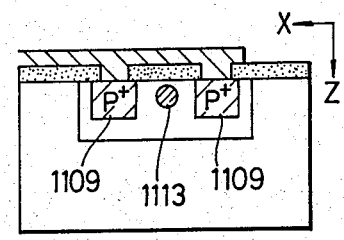

FIG. 13 is a diagram of an embodiment having a plurality of priming transfer portions A of the type illustrated in FIGS. 12A to 12F. This embodiment has a feature that the value of W in formula (18) can be increased; therefore, it is possible to increase $\tilde{g}_m$ and $g_m$ to a value which is one or two orders of magnitude larger than in a conventional MOSFET.

The n channel SISO-SITs used in the above embodiment may be replaced p channel SISO-SITs.

As described above, since the priming transfer device is constructed of junction gate type SISO-SITs or high $g_m$ and ideal saturated characteristic MOS gate devices, the transfer coefficient can be increased by one or two orders of magnitude larger. Furthermore, with a plurality of charge priming transfer portion in a single device, a further improvement to a value one or two orders of magnitude larger is possible. Therefore it is possible to provide a superior priming transfer device having low noise within a relatively small internal bias charge.

In addition, when the control electrode TC has multiple stages, the invention may be modified in various manners such that it has a high-speed and high performance BBD comparable to a CCD.

A fourth embodiment of the present invention is described in connection with a solid state imaging device in which an SISO-SIT is used as light-receiving element.

FIGS. 14A through 14E are respectively a top plan view of one pixel of a vertically formed SISO-SIT phototransistor of the fourth embodiment, a horizontal cross-sectional view taken along a line a—a', a horizontal cross-sectional view taken along a line b—b', a vertical cross-sectional view taken along a line c—c', and a vertical cross-sectional view taken along a line d—d'.

In FIGS. 14A to 14E, on an n+ drain substrate 1401 (impurity concentration $N=10^{17}$ to $10^{20}$ cm$^{-3}$) is formed an n$^-$ epitaxial layer 1402 ($N=10^{12}$ to $10^{17}$ cm$^{-3}$) in the surface of the n$^-$ epitaxial layer 1402 are formed a p+ region 1403 ($N=10^{17}$ to $10^{20}$ cm$^{-3}$), and another n$^-$ epitaxial layer 1404 ($N=10^{12}$ to $10^{17}$ cm$^{-3}$). On the surface of this n$^-$ epitaxial layer 1404 are formed an n+ source region 1405 ($N=10^{17}$ to $10^{20}$ cm$^{-3}$), a p+ first gate region 1406 ($N=10^{17}$ to $10^{20}$ cm$^{-3}$), and a pixel separating p+ region 1407 ($N=10^{17}$ to $10^{20}$ cm$^{-3}$). Source electrode 1408 and a first gate electrode 1409 are respectively in contact with corresponding regions through contact windows in insulating film 1410.

A second gate p+ region 1403 and n+ drain region 1401 respectively contact a corresponding second gate electrode and drain electrode around the peripheral portion. In FIGS. 14B and 14D, circular intrinsic gate region 1411 has a saddle point potential barrier formed by a first gate p+ region 1406. Since the distance between the source and the intrinsic gate region is small, a series resistance between there is extremely small such that the product of the series resistance and the transconductance $g_m$ is less than 1, to provide the large $g_m$ of an unsaturated SIT.

Furthermore, the sizes of the regions are determined so that the minimum length $W_{G2}$ of window of p+ regions 1403 of the second gate is less than the distance $l_{GG}$ between the p+ region 1406 of the first gate and the p+ region 1403 of the second gate, i.e., $$l_{GG} > W_{G2}; \qquad (33)$$

the similarity of Formulae (28) and (33) is noted.

In addition, the p+ region 1403 of the second gate is A.C. grounded, and is supplied with a D.C. voltage.

The SISO-SIT phototransistor having the above-described structure operates as follows. In this embodiment, charges are read out by an electron-depletion operation.

As shown in FIGS. 14A to 14E, as the p+ region 1406 of the first gate surrounds the n+ source region 1405, the channel potential of the intrinsic gate region 1411 close to the n+ source region 1405 becomes lower than other channel portions. Therefore, potential barrier 1501, FIG. 15, is formed against electrons flowing from the n+ region 1405 of source to the n+ drain region 1401. FIG. 15 includes energy band diagrams along lines K—K' and L—L', FIG. 14.

Light incident on the surface causes electrons from electron-hole pairs to flow into the n+ drain region 1401 having a deep potential level; most of the holes are stored in the p+ floating gate region 1406. Although a portion of the holes have a chance to be absorbed by the p+ pixel separating region 1407, such phenomenon can be avoided by applying a positive bias voltage.

The SISO-SIT type phototransistor operates such that the high-resistance region (i.e., the n$^-$ epitaxial layer region 1404 which is generally called an "i" region) becomes a substantially depleted region with only a diffusion potential of the p+ first gate region 1406. A portion around the p+ first gate hole storing region 1406 becomes a "p+ i n+" photodiode sandwiching the high-resistance depletion region ("i") region); therefore the holes generated as a part of the pairs effectively flow into the p+ region 1406 of the first gate.

Figure 14A:
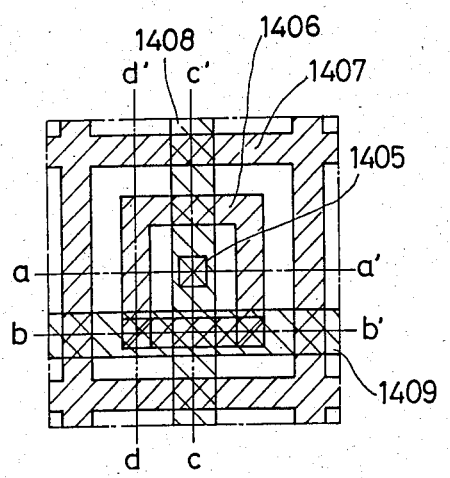
FIGS. 14A through 14E are respectively a top plan view of an SISO-SIT type phototransistor with electron depletion operation, a horizontal cross-sectional view taken along a line a—a', a horizontal cross-sectional view taken along a line b—b', a vertical cross-sectional view taken along a line c—c', and a vertical cross-sectional view taken along a line d—d'.
Figure 14D:
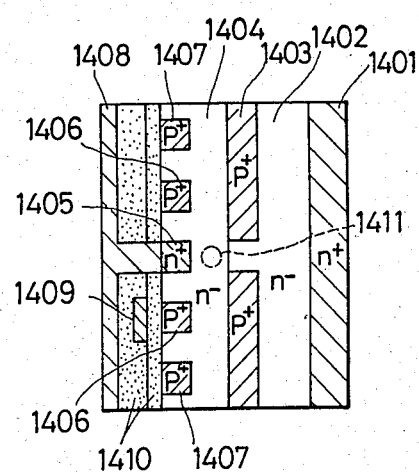
Figure 14B:
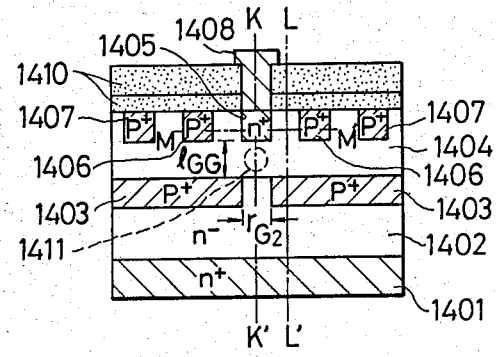
Figure 14E:
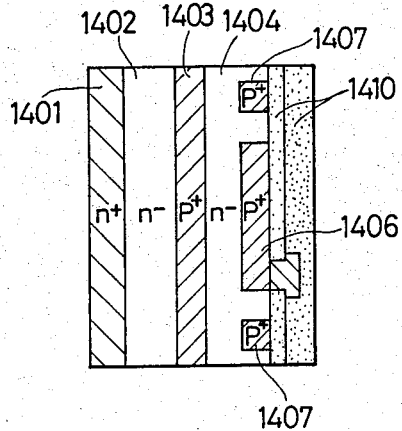
Figure 14C:
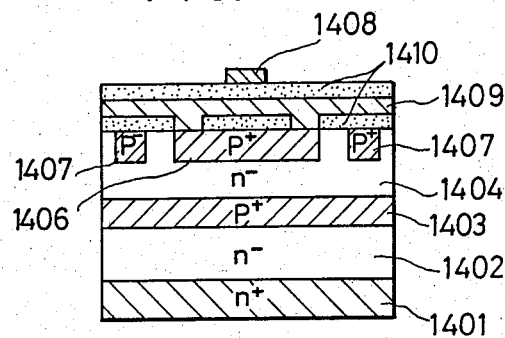
Figures 15A, 15B:
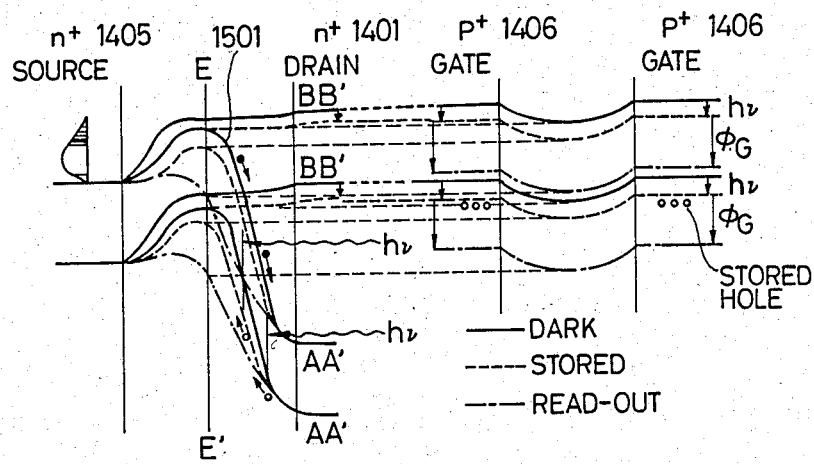
FIGS. 15A and 15B are diagrams of the potential distributions in along the longitudinal and transverse axes of the channel of an SISO-SIT phototransistor, respectively.

In FIGS. 15A and 15B is indicated the potential distribution of the SISO-SIT type phototransistor of FIGS. 14A to 14E. In FIG. 15A is illustrated the potential distribution along the lines K—K' and L—L' of FIG. 14B; the solid curves indicate a dark state, while the dotted curves indicate that the p+ first gate region 1406 is charged to a positive potential. Holes of the p+ first gate region 1406 are stored as a result of detection of light; the dot-dash curves indicating a read-out state. The potential distribution along line M—M', FIG. 14B, corresponding to the bove is shown in FIG. 15B.

During read-out, a pulse is applied from the first gate electrode 1409 to the p+ first gate region 1406. If the voltage of the pulse applied to the p+ first gate region 1406 is small, holes stored in the first gate region 1406, where there is a shallow potential level, cannot easily escape, enabling nondestructive read-out to take place. If a large voltage pulse is applied to the p+ first gate region 1406, holes stored in the p+ first gate region 1406 are expelled to the n+ source region 1405 (or the pixel-separating p+ region 1407) and the potential distribution returns to the dark state shown by solid curves where normal destructive read-out takes place.

When optically induced holes stored in the p+ first gate region 1406 move to the n+ source region 1405 in the presence of the applied pulse, the holes stored in the p+ first gate region 1406, where the potential level is inherently shallow, have to climb over a very high diffusion potential barrier to flow to the n+ source region 1405, having a deep potential level. On the other hand, electrons in the n+ source region 1405 are injected into the channel if they climb over a low potential barrier of the intrinsic gate region 1411. Therefore, the number of injected electrons is "m" times the number of holes, wherein "m" is a positive integer. This provides a photo-multiplying effect. At this time, if the n+ source region 1405 is in a floating state, signal information is stored in an electron depletion state. In a conventional SIT, a transient drain voltage variation depending on the incident light intensity undergoes a change in photo-multiplying power at this occasion since the potential variation at the n+ drain region 1401 is fed back to the potential barrier of the intrinsic gate region 1411. However, in the SISO-SIT according to the present invention, such undesirable feedback does not occur because of the electrostatic shield effect of the p+ second gate region 1403; therefore the multiplying effect does not depend on the intensity of light.

Figure 16:
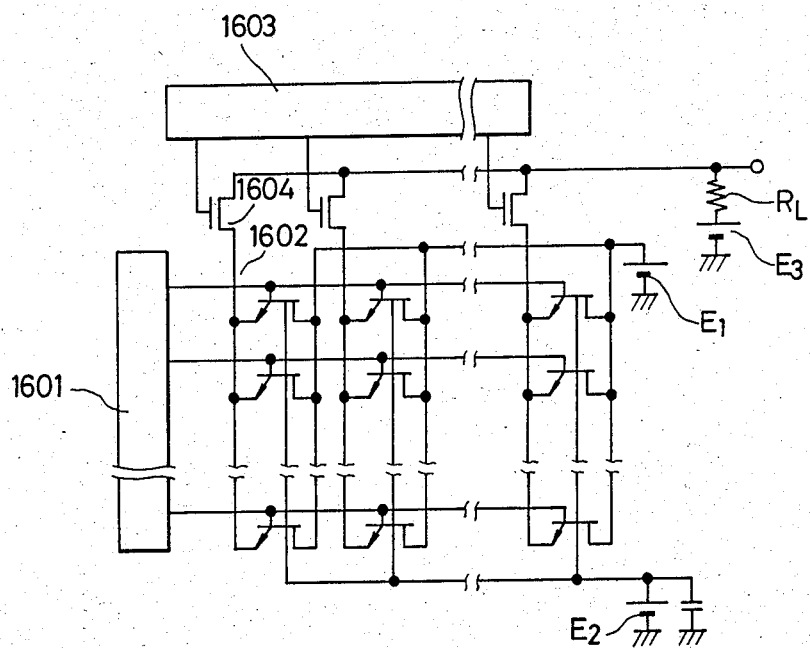
FIG. 16 is a structural diagram of an imaging device using an SISO-SIT type phototransistor with electron depletion operation.
Figure 17B:
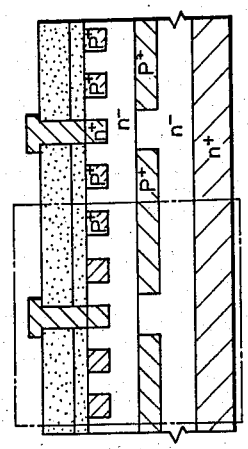
FIGS. 17A through 17E are layout diagrams of respective light-receiving portions of FIG. 16.
Figure 17C:
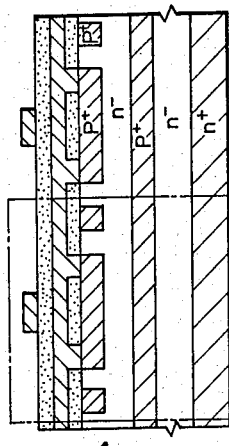
Figure 17E:
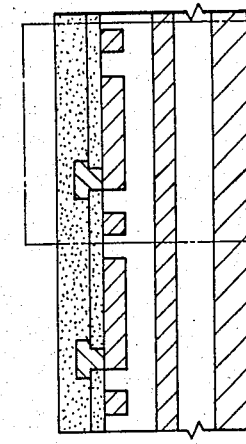
Figure 17D:
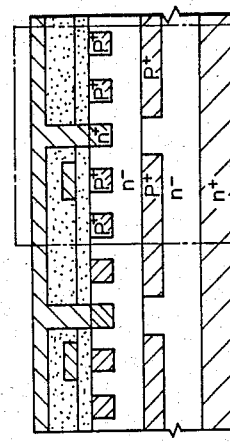
Figure 17A:
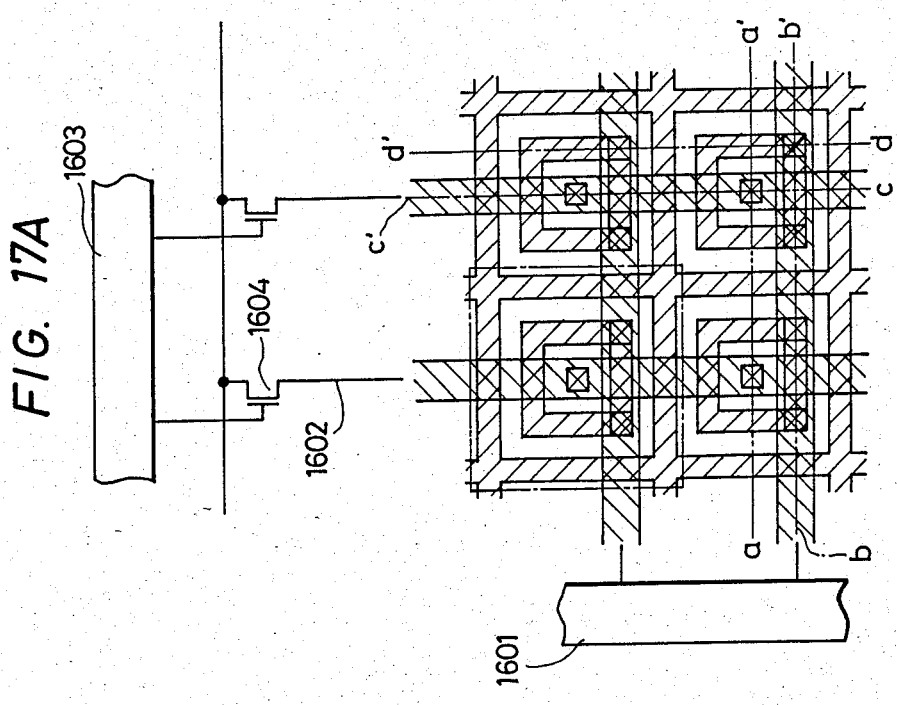
Figure 18A:
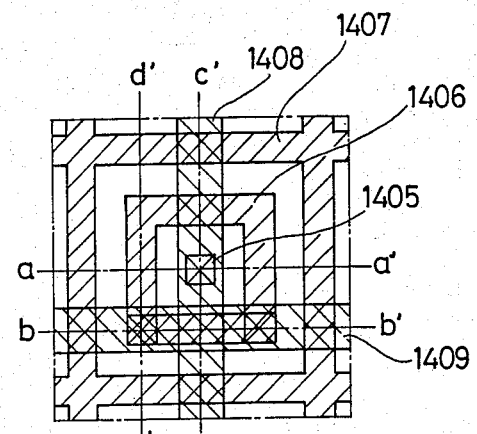
Figure 18B:
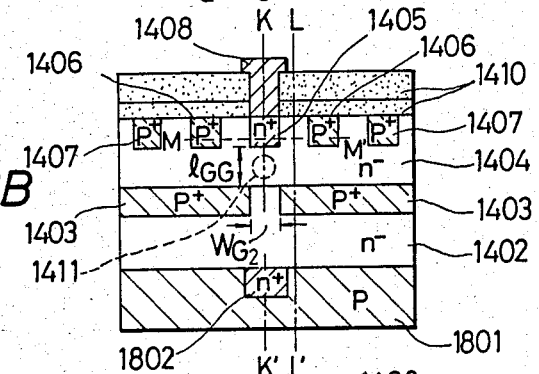
Figure 18C:
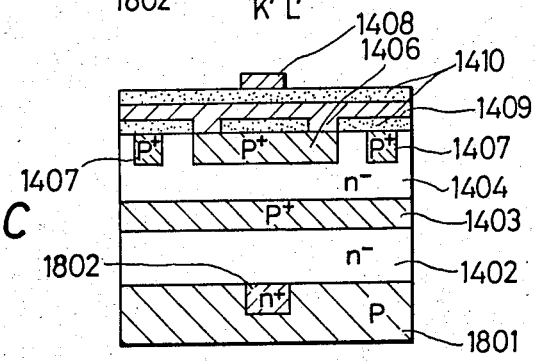

FIG. 16 is a two-dimensional arrangement of SISO-SIT type phototransistors performing the above described electron depletion operation. A vertical scanning circuit 1601 applies a read-out pulse to the p+ first gate region 1406 of the SISO-SIT type phototransistors. The number of electrons injected from the source to the drain thense to power source E, is "m" (where "m" is a postive integer) times the number of holes stored in response to the incident light. As a result, the n+ region 1405 and vertical signal transmission line 1602 are activated into an electron depletion state. The p+ region 1403 of the second gate is connected to another power source $E_2$. Then, as horizontal MOS switches successively open and close under the control of a horizontal scanning circuit 1603, electrons are injected from a power source $E_3$ into the vertical signal transmission line 1602 after flowing via a load resistor $R_L$ across which is generated a signal voltage.

In FIG. 17 is shown a layout of the light-receiving portion corresponding to the two-dimensional arrangement of the unit of FIGS. 14A to 14E.

As described above, the present embodiment provides a stable multiplying effect without depending on the intensity of incident light since SISO-SIT type phototransistors having ideal saturated current-voltage characteristic are used as light-receiving elements.

Although the above embodiment has been described as performing an electron depletion operation, an electron storing operation is also possible if the structure is partially changed. A pixel portion of such a changed structure is shown in FIGS. 18A to 18D.

FIGS. 18A through 18E are respectively a top plan view of an SISO-SIT type phototransistor having an electron storing operation, a horizontal cross-sectional view taken along line a—a', a horizontal cross-sectional view taken along line b—b', a vertical cross-sectional view taken along line c—c', and a vertical cross-sectional view taken along line d—d'.

As shown in FIGS. 18A to 18E, a "p" substrate 1801 ($N = 10^{12}$ to $10^{17}$ cm$^{-3}$), is used in place of the n+ substrate 1401 of FIG. 14A. An n+ drain region 1802 is formed on the "p" substrate 1801 as a vertical signal transmission line. Then, n$^-$ epitaxial layer 1402 is formed, and then the same process as that of FIG. 14A is performed.

Read-out of the structure of FIG. 18-A is the same as that for the structure in FIG. 14A, except that the number of electrons injected from the n+ region 1405 to the channel is "m" times the number of holes photoelectrically generated in the n+ drain region 1802; the electrons, in FIG. 14A, are stored as signal charges. A further exception is that source electrode 1408 is used in FIG. 18 as a power supply line instead of a signal transmission line.

FIG. 19 is a diagram of a two-dimensional view of SISO-SIT type phototransistors for storing electrons using the above described operations. In FIG. 16, the vertical signal transmission line 1602 is connected to a source electrode; in contrast in FIG. 19, a vertical signal transmission line 1901 is connected to a drain while the source electrode is connected to power source terminal (i.e., ground).

The above-described embodiment of FIGS. 18A to 18E and 19 is capable of operating with stable multiplication without depending on light intensity, and can be applied to a structure having a horizontal scanning circuit formed by CCD.

The polarity of respective regions of the above-described embodiment may be reversed entirely, and an insulating film may be used as a pixel separating region.

As described above, SISO-SIT type phototransistors having ideal current saturation characteristics provide light-multiplying effects without depending on incident light so it is possible to provide an imaging device having very high sensitivity.

As is apparent from the above embodiments, according to the present invention the distance $l_{GG}$ between (1) a first gate region close to a source region and (2) a second gate region for pinching a channel formed between the source region and a drain region as a path of carriers, is greater than the channel width WG2 determined by the second gate region. Also a potential barrier is formed in the channel around the first gate, whereby an SISO-SIT having ideal saturated voltage-current characteristic is provided without reducing the high transconductance inherent in unsaturated SIT's.

Furthermore, when the potential barrier is formed by a tunnel barrier, a saturated tunnel transistor "SISO-BATT" is formed.

Moreover, when a plurality of the SISO-SITs according to the present invention are used, a charge transfer device CPD capable of setting potential with high accuracy and with high speed is provided. This can be widely applied to VLSI, especially memories.

In addition, a solid state imaging device thus constructed using a plurality of SISO-SIT type phototransistors, is extremely advantageous for miniaturization and high density assembling since high sensitivity is attained.

Although embodiments of the present invention have been described using Formula (28) as a condition for provided an SISO-SIT as described above, such a condition of an SISO-SIT is attained only with the second gate; such an embodiment is now described with reference to FIGS. 20A to 20E and FIGS. 21A and 21B.

FIGS. 20A through 20E are respectively a top plan view of an SISO-SIT having a horizontally formed junction gate, a cross-sectional view taken along line a—a', a cross-sectional view taken along b—b', a cross-sectional view taken along c—c', and a symbol.

In FIGS. 20A to 20E, on p substrate 2001 (impurity concentration $N=10^{12}$ to $10^{17}$ cm$^{-3}$) is formed an n$^-$ well 2002 ($N=10^{12}$ to $10^{17}$ cm$^{-3}$). In the surface of the n$^-$ well 2002 are formed an n$^+$ source region 2003 ($N=10^{17}$ to $10^{20}$ cm$^{-3}$), an n$^+$ drain region 2004 ($N=10^{17}$ to $10^{20}$ cm$^{-3}$), a p$^+$ first gate (G1) region 2005 ($N=10^{17}$ to $10^{20}$ cm$^{-3}$), and a p$^+$ second gate (G1) region 2006 ($N=10^{17}$ to $10^{20}$ cm$^{-3}$), which respectively contact source electrode 2007, drain electrode 2008, a first gate electrode 2009, and a second gate electrode 2010 through contact windows in insulating film 2011.

In FIGS. 20A and 20B, circle 2012 indicates a region where a saddle point potential barrier formed by a p$^+$ region 2005 of a first gate exists; this region is referred to as an intrinsic gate region 2012 hereinafter.

Figure 21A:
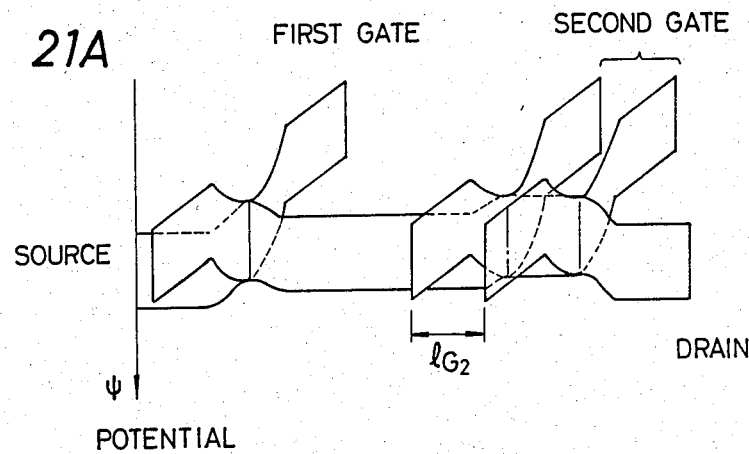
FIGS. 21A and 21B are energy band diagrams for the embodiment of FIGS. 20A through 20E, assuming the device is in thermal equilibrium state and is operating.
Figure 21B:
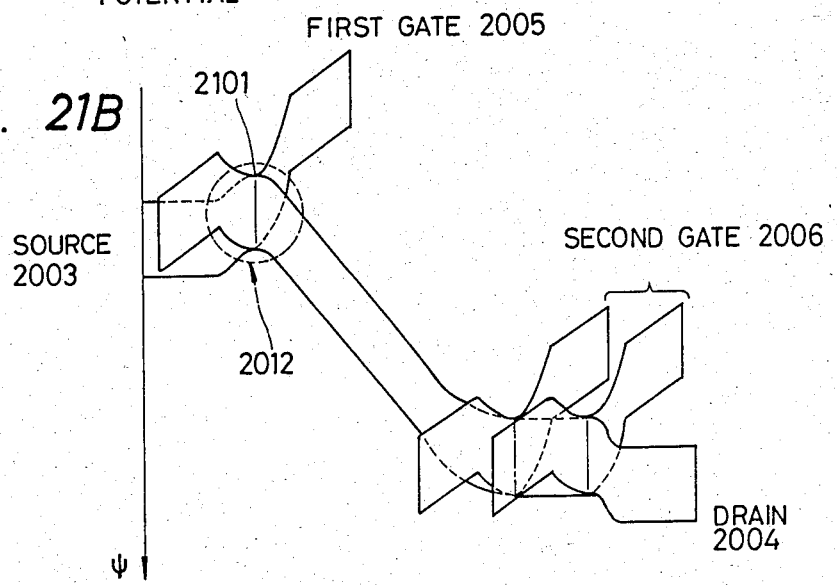

By making the distance $W_{G1}$ between a pair of p$^+$ regions 2005 of the first gate narrower than other channels, it is easy to provide a saddle point potential barrier 2101 intrinsic gate region 2012 as shown in FIG. 21B. The number of electrons injected from n$^+$ source region 2003 to drain is controlled by the height of the potential barrier 2101. By setting the distance between n$^+$ source region 2003 and the intrinsic gate region 2012 to a sufficiently small value, a series resistance between the source electrode and the intrinsic gate region becomes extremely small and the product of $r_S$ and transconductance $g_m$ becomes 1 or less and a large $g_m$, which is inherent to SIT, is attained.

When the distance $l_{G2}$ between the place where the channel width $W_{G2}$, i.e., the distance $W_{G2}$ between a pair of p$^+$ second gate regions 2006 adjacent the n$^+$ drain region 2004, determined by the second gate region is the narrowest (when $W_{G2}$ is constant over the channel, a portion of the second gate closest to the source region), and the drain region is:

$$l_{G2} > W_{G2} \tag{34}$$

and when the p$^+$ region 2006 of the second gate is used in reverse biased state with respect to n$^+$ drain region 2004 for D.C. and is grounded for A.C., the influence of the potential of the n$^+$ drain region 2004 is completely electrostatically shielded so that intrinsic gate region 2012 does not influence potential barrier 2101. In this way, the potential barrier 2101 of the intrinsic gate region 2012 is controlled by static induction caused by the voltage applied to the p$^+$ first gate region 2005, while the potential barrier 2101 does not depend upon the drain voltage due to the electrostatic shield effect of the p$^+$ second gate region 2006. Therefore, a saturated current characteristic is obtained, keeping a high $g_m$ of unsaturated SIT.

FIGS. 21A and 21B are energy band diagrams corresponding to the above operation. In FIG. 21A is shown the thermal equilibrium state, while in FIG. 21B is shown an operating state. In the above-described embodiment when formula (34) is satisfied and:

$$l_{G1} > W_{G1} \tag{35}$$

a bidirectional characteristic is also achieved.

The above-described embodiments are just examples of the present invention, and therefore, it will be apparent for those skilled in the art that many modifications and variations may be made without departing from the scope of the present invention.

What is claimed is:

1. A semiconductor device comprising:
 (a) a source region of a first conductivity;
 (b) a drain region of said first conductivity;
 (c) a semiconductor region of said first conductivity for forming a channel functioning as a path of carriers between said source region and said drain region;
 (d) a substrate region of a second conductivity surrounding said semiconductor region;
 (e) a pair of first gate regions of said second conductivity formed in said semiconductor region at a location close to said source region;
 a potential barrier being formed at a location in said channel close to said first gate region, various portions of the device having an impurity concentration and dimensions selected so that a series resistance $r_s$ from said source region to said potential barrier is less than the reciprocal of the transconductance gm of the device,
 said potential barrier being formed by the depletion layer extending into said semiconductor region from said first gate region even when no voltage is applied to said first gate regions; and
 (f) a pair of second gate regions of said second conductivity formed in said semiconductor region at a location close to said first gate regions, the dimension of various portions of the device so $$l_{GG} > W_{G2} > \Delta l_n + \Delta l_p$$

wherein $l_{GG}$ is the shortest distance between said first and second gate regions;
$W_{G2}$ is the shortest channel width determined by said second gate regions;
$\Delta l_n$ is the shortest distance between said gate regions and said substrate region; and
$\Delta l_p$ is the depletion layer width of said substrate region extending from said semiconductor region;
said second gate regions functioning as an electric shielding electrode to make said first gate regions free from the voltage of said drain region.

2. A semiconductor device as claimed in claim 1, wherein said size of said various portions is selected so that a distance $L_{DS}$ between said source region and said drain region has a relationship of $L_F > L_{DS}$ with mean free path $L_F$.

3. A semiconductor device as claimed in claim 1, wherein said source region is in a degenerate state and said potential barrier is a tunnel barrier so that carriers tunnel between conduction and valance band.

4. A semiconductor device as claimed in claim 1, wherein said first gate region is in floating state, and is arranged such that second carriers, whose number is "m" times the number of first carriers stored after photoelectric generation in said first gate region, are injected from said source region to said drain region wherein "m" is a positive integer.

5. A semiconductor device as claimed in claim 4, wherein a plurality of said first gate regions are arranged in two-dimensional fashion, said semiconductor device further comprising:
(a) a vertical scanning means;
(b) a vertical transmission line provided in correspondence with respective rows of said first regions;
(c) a horizontal scanning means;
(d) a horizontal transmission line provided in correspondence with said vertical transmission line; and
(e) a switch means provided between said vertical transmission line and said horizontal transmission line, said switch means being controlled by said horizontal scanning means.

6. A semiconductor device, comprising:
(a) a source region:
(b) a drain region;
(c) a semiconductor region for forming a channel functioning as a path of carriers between said source region and said drain region;
(d) a first gate region formed in said semiconductor region at a place close to said source region; and
(e) a second gate region formed at a place close to said drain region;
a potential barrier being formed at a place in said channel close to said first gate region;
impurity concentration and sizes of various portions being selected so that a series resistance $r_s$ from said source region to said potential barrier has a relationship with transconductance $g_m$ such that:

$$r_s < 1/g_m$$

said second gate region functioning as an electrically shielding electrode with respect to said drain region.

7. A semiconductor device as claimed in claim 6, wherein said size of said various portions is selected so that the relationship of $l_{G2} > W_{G2}$ is satisfied and said potential barrier is of saddle point, wherein $W_{G2}$ is a channel width determined by the second gate region and lG2 is a distance between a place where the channel width $W_{G2}$ is the narrowest and said drain region.

8. A semiconductor device as claimed in claim 7, wherein said size of said various portions is selected so that the channel width $W_{G1}$ determined by said first gate region and the length $l_{G1}$ of said first gate region itself in a direction of said channel causes $l_{G1} > W_{G1}$.

9. A semiconductor device as claimed in claim 6, wherein said size of said various portions is selected so that the relationship of $l_{G2} > W_{G2}$ is satisfied and said potential barrier is of saddle point, wherein $W_{G2}$ is a channel width determined by the second gate region and lG2 is a distance between a portion of said second gate closest to said source when WG2 is constant over the channel and said drain region.

10. A semiconductor device as claimed in claim 9, wherein said size of said various portions is selected so that channel width $W_{G1}$ determined by said first gate region and the length $l_{G1}$ of said first gate region itself in a direction of said channel causes $l_{G1} > W_{G1}$.

11. A semiconductor device comprising:
(a) a semiconductor substrate of one conduction type;
(b) a semiconductor region of the other conduction type formed on said substrate;
(c) first through third charge storing regions of the other conduction type formed in said semiconductor region of the other conduction type, said first through third charge storing regions respectively having capacitances of $C_1$, $C_2$ and $C_3$ which have the relationship of $C_1 > C_2 > C_3$;
(d) first through fourth gate regions formed in said semiconductor region of the other conduction type;
(e) a control electrode capacitance coupled with said second charge storing region;
(f) a first saddle point potential barrier formed in a first channel between said first charge storing region and said second charge storing region at a place close to said first charge storing region of said one conduction type;
(g) a second saddle point potential barrier formed in a second channel between said second charge storing region and said third charge storing region at a place close to said second charge storing region of said one conduction type;
the impurity concentration and size of the respective regions being selected so that the following two formulas are satisfied:

$$L_{TS1} > W_{S1}$$

$$L_{TS2} > W_{S2}$$

wherein
$L_{TS1}$ is an interval between said first and second gate regions sandwiching therebetween said first channel;
$W_{S1}$ is an interval between a pair of said second gate regions sandwiching therebetween said first channel;
$L_{TS2}$ is an interval between said third and fourth gate regions sandwiching therebetween said second channel;
$W_{S2}$ is an interval between a pair of said fourth gate regions sandwiching therebetween said second channel.

* * * * *